United States Patent
Mikawa et al.

(10) Patent No.: US 8,258,493 B2
(45) Date of Patent: Sep. 4, 2012

(54) NONVOLATILE SEMICONDUCTOR MEMORY APPARATUS AND MANUFACTURING METHOD THEREOF

(75) Inventors: Takumi Mikawa, Shiga (JP); Takeshi Takagi, Kyoto (JP)

(73) Assignee: Panasonic Corporation, Osaka (JP)

( * ) Notice: Subject to any disclaimer, the term of this patent is extended or adjusted under 35 U.S.C. 154(b) by 411 days.

(21) Appl. No.: 12/515,379

(22) PCT Filed: Nov. 13, 2007

(86) PCT No.: PCT/JP2007/071962
§ 371 (c)(1),
(2), (4) Date: May 18, 2009

(87) PCT Pub. No.: WO2008/062688
PCT Pub. Date: May 29, 2008

(65) Prior Publication Data
US 2010/0032641 A1    Feb. 11, 2010

(30) Foreign Application Priority Data
Nov. 20, 2006    (JP) .................................. 2006-312590

(51) Int. Cl.
*H01L 29/00*    (2006.01)

(52) U.S. Cl. .. 257/1; 257/2; 257/3; 257/5; 257/E45.001; 257/E45.002; 257/E45.003; 365/148

(58) Field of Classification Search .................. 257/1–5, 257/43, E45.001, E45.002, E45.003; 365/148
See application file for complete search history.

(56) References Cited

U.S. PATENT DOCUMENTS

| | | | |
|---|---|---|---|
| 6,753,561 B1 | 6/2004 | Rinerson et al. | |
| 2004/0202041 A1* | 10/2004 | Hidenori | 365/233 |
| 2005/0167699 A1 | 8/2005 | Sugita et al. | |
| 2006/0268594 A1 | 11/2006 | Toda | |
| 2008/0105878 A1* | 5/2008 | Ohara | 257/74 |

FOREIGN PATENT DOCUMENTS

| | | |
|---|---|---|
| JP | 2003-059281 | 2/2003 |
| JP | 2003-068984 | 3/2003 |
| JP | 2003-197880 | 7/2003 |
| JP | 2003-273335 | 9/2003 |

(Continued)

*Primary Examiner* — Pho M Luu
(74) *Attorney, Agent, or Firm* — McDermott Will & Emery LLP

(57) ABSTRACT

A nonvolatile semiconductor memory apparatus (10) of the present invention comprises a substrate (10), lower-layer electrode wires (15) provided on the substrate (11), an interlayer insulating layer (16) which is disposed on the substrate (11) including the lower-layer electrode wires (15) and is provided with contact holes at locations respectively opposite to the lower-layer electrode wires (15), resistance variable layers (18) which are respectively connected to the lower-layer electrode wires (15); and non-ohmic devices (20) which are respectively provided on the resistance variable layers (18) such that the non-ohmic devices are respectively connected to the resistance variable layers (18). The non-ohmic devices (20) each has a laminated-layer structure including plural semiconductor layers, a laminated-layer structure including a metal electrode layer and an insulator layer, or a laminated-layer structure including a metal electrode layer and a semiconductor layer. One layer of the laminated-layer structure is embedded to fill each of the contact holes and the semiconductor layer or the insulator layer which is the other layer of the laminated-layer structure has a larger area than an opening of each of the contact holes and is provided on the interlayer insulating layer (16).

8 Claims, 13 Drawing Sheets

FOREIGN PATENT DOCUMENTS

| | | |
|---|---|---|
| JP | 2004-319587 | 11/2004 |
| JP | 2004-363604 | 12/2004 |
| JP | 2005-317787 | 11/2005 |
| JP | 2006-514393 | 4/2006 |
| JP | 2006-140489 | 6/2006 |
| JP | 2006-203098 | 8/2006 |
| JP | 2007-180473 | 7/2007 |
| WO | WO 00/48196 | 8/2000 |
| WO | WO 2005/041303 A1 | 5/2005 |
| WO | WO 2007/116749 A1 | 10/2007 |

* cited by examiner

NONVOLATILE SEMICONDUCTOR MEMORY APPARATUS AND MANUFACTURING METHOD THEREOF

RELATED APPLICATIONS

This application is the U.S. National Phase under 35 U.S.C. §371 of International Application No. PCT/JP2007/071962, filed on Nov. 13, 2007, which in turn claims the benefit of Japanese Application No. 2006-312590, filed on Nov. 20, 2006, the disclosures of which Applications are incorporated by reference herein.

TECHNICAL FIELD

The present invention relates to a cross-point nonvolatile semiconductor memory apparatus using a resistance variable layer. Particularly, the present invention relates to a configuration in which a diode is incorporated to be connected in series with the resistance variable layer.

BACKGROUND ART

In recent advancement of digital technologies in electronic hardware, larger-capacity and nonvolatile semiconductor memory apparatuses have been vigorously developed in order to store data of music, images, information and so on. For example, nonvolatile semiconductor memory apparatuses using ferroelectric substances as capacitive elements are now used in various fields. Furthermore, in contrast to the nonvolatile memory apparatus using the ferroelectric capacitors, a nonvolatile semiconductor memory apparatus (hereinafter referred to as ReRAM) using a material whose resistance value changes according to electric pulses applied and continues to keep its state has attracted an attention because it can easily have compatibility with a normal semiconductor process.

For example, there is disclosed an apparatus configuration, for enabling the use of the existing DRAM step as it is, in a ReRAM including one transistor and one memory portion (see, e.g., patent document 1). The ReRAM includes transistors and nonvolatile memory portions connected to drains of the transistors. The memory portion has a structure in which a resistance variable layer whose resistance reversibly changes according to current pulses applied is sandwiched between an upper electrode and a lower electrode. As the resistance variable layer, a nickel oxide (NiO), a vanadium oxide ($V_2O_5$), a zinc oxide (ZnO), a niobium oxide ($Nb_2O_5$), a titanium oxide ($TiO_2$), a tungsten oxide ($WO_3$), a cobalt oxide (CoO), etc is used. It is known that the transition metal oxide is allowed to have a specified resistance value by application of a voltage or current having a threshold or higher and to hold the resistance value until the transition metal oxide is newly applied with a voltage or current. And, the transition metal oxide can be manufactured using the existing DRAM step as it is.

The above illustrated example includes one transistor and one nonvolatile memory portion. Also, a cross-point ReRAM using a perovskite structure material is also disclosed (see, e.g., patent document 2). This ReRAM has a structure in which stripe-shaped lower electrodes are provided on a substrate and an active layer is provided so as to cover the entire surface of the lower electrodes. As the active layer, a resistance variable layer whose resistance reversibly changes according to electric pulses is used. On the active layer, stripe-shaped upper electrodes are provided to respectively cross the lower electrodes at a right angle. A region where each of the lower electrodes and each of the upper electrodes cross each other such that the active layer is sandwiched between the lower electrode and the upper electrode forms a memory portion. The lower electrodes and the upper electrodes serve as word lines or bit lines. With such a cross-point configuration, a larger capacity is attainable.

In the cross-point ReRAM, a diode is incorporated into the ReRAM such that the diode is connected in series with the resistance variable layer to avoid the influence from the resistance variable layers on another rows or columns, when reading the resistance value of the resistance variable layer provided at the cross-point.

For example, a ReRAM is disclosed, which comprises a substrate including two or more bit lines arranged to extend at parallel intervals, two or more word lines arranged to extend at parallel intervals and to cross the bit lines, resistor structures provided at points where the bit lines and the word lines cross each other and are located on the bit lines, and diode structures provided on the resistor structures in contact with the resistor structures and the word lines, lower electrodes provided on the substrate, resistor structures provided on the lower electrodes, diode structures provided on the resistor structures, and upper electrodes provided on the diode structures (see, e.g., patent document 3).

In such a configuration, since a unit cell structure is allowed to have a laminated-layer structure in which one diode structure and one resistor structure are continuously laminated, an array cell structure is easily attainable.

A ReRAM having a cross-point configuration is also disclosed, in which memory plugs are arranged at cross points where X-direction conductive array lines and Y-direction conductive array lines cross each other (e.g., see patent document 4). The memory plug is formed by seven layers. A composite metal oxide sandwiched between two electrode layers forms a memory element. A metal-insulator-metal (MIM) structure provided on the memory element forms a non-ohmic device.

The cross-point configuration is used for MRAM, or the like. Various studies have been made to solve the similar problems. For example, a laminated structure in which word lines, resistance variable layer patterns, semiconductor layer patterns and bit lines are laminated, is disclosed, in which the resistance variable layer pattern and the semiconductor layer pattern form a schottky diode, or the semiconductor layer pattern and the bit line form a schottky diode (see patent document 5).

Or, a MRAM including a plurality of word lines, a plurality of bit lines, and resistive intersection array of memory cells is disclosed, in which the memory cells are connected to bit lines and separate diodes and the separate diodes are connected to respective word lines (see e.g., patent document 6). The separate diode is formed as a schottky-metal-semiconductor diode, and its metal portion is suitably made of platinum (Pt).

Patent document 1: Japanese Laid-Open Patent Application Publication No. 2004-363604
Patent Document 2: Japanese Laid-Open Patent Application Publication No. 2003-68984
Patent document 3: Japanese Laid-Open Patent Application Publication No. 2006-140489
Patent document 4: U.S. Pat. No. 6,753,561 specification
Patent document 5: Japanese Laid-Open Patent Application Publication No. 2003-197880
Patent Document 6: Japanese Laid-Open Patent Application Publication No. 2003-273335

DISCLOSURE OF THE INVENTION

Problems to be Solved by the Invention

The first example discloses a configuration including one diode having a switching function and one resistor, but fails to disclose or suggest a specific structure for the resistor and the diode. The second example discloses the cross-point configuration, but fails to disclose or suggest series connection of the diode and its specific structure.

In contrast to these, the third example discloses a configuration in which the resistor structure is provided on the lower electrode, the diode structure is provided on the resistor structure, the upper electrode is provided on the diode structure, and the diode structure is formed of a p-type oxide or an n-type oxide which are made of NiO, $TiO_2$, or the like. However, since the diode structure disclosed in the third example has an outer dimension equal to that of the resistor structure, it is difficult to increase a current capacity of the diode structure. There is a problem that the diode having a small current capacity is incapable of conducting a sufficiently large current required for writing and thereby stable operation of the ReRAM is not attained.

The fourth example has a problem that the resistance variable layer and the non-ohmic device having the MIM structure are formed within the memory plug, and therefore, a manufacturing method is complex. In addition, in this configuration, since the non-ohmic device has the same shape as the resistance variable layer, a current capacity of the diode cannot be increased. For this reason, the fourth example has a problem that the stable operation of the ReRAM is not attained, as in the above example.

The present invention is directed to solving the above described problems, and an object of the present invention is to provide a nonvolatile semiconductor memory apparatus which is capable of securing a sufficiently large current capacity and of stable operation in a cross-point configuration including a non-ohmic device and a resistance variable layer.

Means for Solving the Problem

With a view to achieving the above described object, a nonvolatile semiconductor memory apparatus of the present invention comprises a substrate; stripe-shaped lower-layer electrode wires provided on the substrate; an interlayer insulating layer which is disposed on the substrate including the lower-layer electrode wires and is provided with contact holes at locations respectively opposite to the lower-layer electrode wires; resistance variable layers which are respectively connected to the lower-layer electrode wires; and non-ohmic devices which are respectively provided on the resistance variable layers such that the non-ohmic devices are respectively connected to the resistance variable layers; wherein the non-ohmic devices each has a laminated-layer structure including plural semiconductor layers, a laminated-layer structure including a metal electrode layer and an insulator layer, or a laminated-layer structure including a metal electrode layer and a semiconductor layer; and wherein one layer of the laminated-layer structure is embedded to fill each of the contact holes and the semiconductor layer or the insulator layer which is the other layer of the laminated-layer structure has a larger area than an opening of each of the contact holes and is provided on the interlayer insulating layer.

In such a configuration, a nonvolatile semiconductor memory apparatus is attainable, which is capable of simplifying the manufacturing step for the non-ohmic devices, of lessening a variation in element characteristics, of having high reproducibility and of providing a sufficient current capacity.

In the above configuration, a plurality of constituent units, each of which includes the interlayer insulating layer, the resistance variable layer, and the non-ohmic device, are stacked to form a layer structure.

In such a configuration, a nonvolatile semiconductor memory apparatus is attainable, which is capable of lessening a variation in the property of the non-ohmic devices, of having high reproducibility, and of having memory portions with an extremely large capacity while ensuring a sufficiently large current capacity.

In the above configuration, the other layers of the laminated-layer structures respectively forming the non-ohmic devices may be provided in stripe shape on the interlayer insulating layer so as to respectively cross the lower-layer electrode wires. In such a configuration, patterning of the other layers of the laminated-layer structures is facilitated. In addition, in the case where the metal electrode layer is used as the other layer, the metal electrode layer can serve as a part of the upper-layer electrode wire. Therefore, the manufacturing step can be further simplified.

In the above configuration, the nonvolatile semiconductor memory apparatus may further comprise stripe-shaped upper-layer electrode wires which are provided on the non-ohmic devices such that the upper-layer electrode wires are respectively connected to the non-ohmic devices and respectively cross the lower-layer electrode wires. In such a configuration, since the upper-layer electrode wires can be provided independently of the non-ohmic devices, optimal materials can be selected for the upper-layer electrode wires and for the non-ohmic devices. In addition, for example, when the resistance variable layers and the non-ohmic devices are formed on a silicon single crystal substrate provided with a semiconductor circuit including active elements such as transistors, etc, electric connection between the upper-layer electrode wires and the active elements can be easily made.

In the above configuration, the non-ohmic devices may be MIM diodes each having a laminated-layer structure including three layers which are an insulator layer and metal electrode layers sandwiching the insulator layer, and the metal electrode layer which is closer to the resistance variable layer may be embedded to fill each of the contact holes. Or, the non-ohmic devices may be MSM diodes each having a laminated-layer structure including three layers which are a semiconductor layer and metal electrode layers sandwiching the semiconductor layer, and the metal electrode layer which is closer to the resistance variable layer may be embedded to fill each of the contact holes.

In such a configuration, non-ohmic devices which have a large current capacity and have less variation in properties, are easily attainable.

In the above configuration, the non-ohmic devices may be p-n junction diodes each having a laminated-layer structure including two layers which are a p-type semiconductor layer and an n-type semiconductor layer, and the p-type semiconductor layer or the n-type semiconductor layer may be embedded to fill each of the contact holes. In such a configuration, crosstalk which would occur during reading or writing can be further reduced by utilizing a rectifying property of the diodes. In addition, a circuit configuration therefor can be simplified.

In the above configuration, the non-ohmic devices may be schottky diodes each having a laminated-layer structure including two layers which are a semiconductor layer and a metal electrode layer, and the metal electrode layer may be embedded to fill each of the contact holes. In the schottky diode having such a configuration, majority carrier is dominant. Therefore, a current capacity can be increased and a high-speed operation can be achieved.

A method of manufacturing a nonvolatile semiconductor memory apparatus of the present invention comprises a step for forming stripe-shaped lower-layer electrode wires on a substrate; a step for forming an interlayer insulating layer on the substrate including the lower-layer electrode wires; a step for forming contact holes in an interlayer insulating layer at locations respectively opposite to the lower-layer electrode wires; a step for embedding resistance variable layers to fill the contact holes except for portions at an upper side of the interlayer insulating layer; a step for embedding at least one layers of laminated-layer structures respectively forming non-ohmic devices to fill the portions at the upper side of the contact holes; and a step for forming, on the interlayer insulating layer, the other layers of the laminated-layer structures respectively forming the non-ohmic devices such that the other layers have a larger area than openings of the contact holes.

In such a method, since at least one layers of the laminated-layer structures respectively forming the non-ohmic devices are embedded to fill the contact holes such that they are coplanar with the interlayer insulating layer and have very smooth surfaces, a favorable interface condition of the non-ohmic devices is obtained. As a result, reduction or variation of the pressure resistance due to electric field concentration or the like can be suppressed and a current capacity can be increased.

In the above method, the step for embedding the resistance variable layers to fill the contact holes may include a step for forming, inside the contact holes and on the interlayer insulating layer, a first deposited film which is made of a material for the resistance variable layers and a step for removing a portion of the first deposited film which covers a surface of the interlayer insulating layer; and the step for embedding at least one layers of laminated-layer structures respectively forming non-ohmic devices to fill the portions at the upper side of the contact holes may include a step for removing portions of the first deposited film inside the contact holes to form recesses formed by the contact holes and the first deposited film, a step for forming, inside the recesses and on the interlayer insulating layer, a second deposited film which is made of a material for the at least one layers, and a step for removing a portion of the second deposited film which covers the surface of the interlayer insulating layer.

In such a method, the resistance variable layer and the at least one layers of the laminated-layer structure forming the non-ohmic device can be respectively surely embedded to fill each of the contact holes.

The above method may further comprise repeating from the step for forming the interlayer insulating layer to the step for forming on the interlayer insulating layer the other layers of the laminated-layer structures respectively forming the non-ohmic devices plural times to stack the resistance variable layers and the non-ohmic devices to form a layer structure. In such a method, a nonvolatile semiconductor memory apparatus including memory portions having a larger capacity is attainable.

In the above method, the other layers of the laminated-layer structures respectively forming the non-ohmic devices may be formed in stripe shape on the interlayer insulating layer so as to respectively cross the lower-layer electrode wires. In such a method, pattering of the other layers of the laminated-layer structures is facilitated. In addition, in the case where the metal electrode layer or the like is formed as the other layer, the metal electrode layer can serve as a part of the upper-layer electrode wire. Therefore, the manufacturing step can be further simplified.

The above method may further comprise forming stripe-shaped upper-layer electrode wires on the non-ohmic devices such that the upper-layer electrode wires are respectively connected to the non-ohmic devices and respectively cross the lower-layer electrode wires. Since the upper-layer electrode wires can be provided independently of the non-ohmic devices, optimal materials can be selected for the upper-layer electrode wires and for the non-ohmic devices and processes respectively adapted for them can be carried out. In addition, for example, when using a silicon single crystal substrate provided with a semiconductor circuit including active elements such as transistors, etc, electric connection between the upper-layer electrode wires and the active elements can be easily made.

The above and further objects, features and advantages of the present invention will more fully be apparent from the following detailed description of preferred embodiments with accompanying drawings.

Effects of the Invention

The nonvolatile semiconductor memory apparatus of the present invention has great advantages that a current capacity is increased and a property of non-ohmic devices can be stabilized with simplified manufacturing steps, since at least one layers respectively forming the non-ohmic devices are embedded to fill the contact holes in the cross-point configuration in which the non-ohmic devices are respectively connected in series with the resistance variable layers.

BRIEF DESCRIPTION OF THE DRAWINGS

FIG. 4(a) is a cross-sectional view showing a state where the interlayer insulating layer is formed. FIG. 4(b) is a plan view showing a state where contact holes are formed. FIG. 4(c) is a cross-sectional view taken in the direction of arrows along line 3A-3A of FIG. 4(b).

FIG. 5(a) is a cross-sectional view showing a state where a thin-film resistance layer which becomes resistance variable layers is formed. FIG. 5(b) is a cross-sectional view showing a state where a portion of the thin-film resistance layer on the interlayer insulating layer is removed by CMP. FIG. 5(c) is a cross-sectional view showing a state where portions of the resistance variable layers inside the contact holes are removed by over-polishing. FIG. 5(d) is a cross-sectional view showing a state where a thin-film electrode layer which becomes embedded electrodes is formed.

FIG. 6(a) is a plan view. FIG. 6(b) is a cross-sectional view taken in the direction of arrows along line 4A-4A of FIG. 6(b).

FIG. 7(a) is a plan view. FIG. 7(b) is a cross-sectional view taken in the direction of arrows along line 4A-4A of FIG. 7(a).

FIG. 8(a) is a cross-sectional view showing a state where the contact holes are formed. FIG. 8(b) is a cross-sectional view showing a state where a thin-film resistance layer which becomes the resistance variable layers is formed. FIG. 8(c) is a cross-sectional view showing a state where a portion of the thin-film resistance layer on the interlayer insulating layer is removed by CMP. FIG. 8(d) is a cross-sectional view showing a state where portions of the resistance variable layers inside the contact holes are removed by over-polishing.

FIG. 9(a) is a view showing a state where a thin-film electrode layer which becomes the embedded electrodes is formed. FIG. 9(b) is a cross-sectional view showing a state where a portion of the thin-film electrode layer on the interlayer insulating layer is removed by CMP. FIG. 9(c) is a cross-sectional view showing a state where the interlayer insulating layer is formed. FIG. 9(d) is a cross-sectional view showing a state where grooves are formed in the interlayer insulating layer.

FIG. 10(a) is a cross-sectional view showing a state where a thin-film insulating layer which becomes the insulator layers and the thin-film electrode layer which becomes the upper electrodes are formed on the interlayer insulating layer including the grooves. FIG. 10(b) is a cross-sectional view showing a state where portions of the thin-film electrode layer and the thin-film insulating layer on the interlayer insulating layer are removed by CMP, embedding portions thereof to fill the grooves.

FIG. 14(a) is a plan view. FIG. 14(b) is a cross-sectional view taken in the direction of arrows along line 14A-14A.

Figure 1:
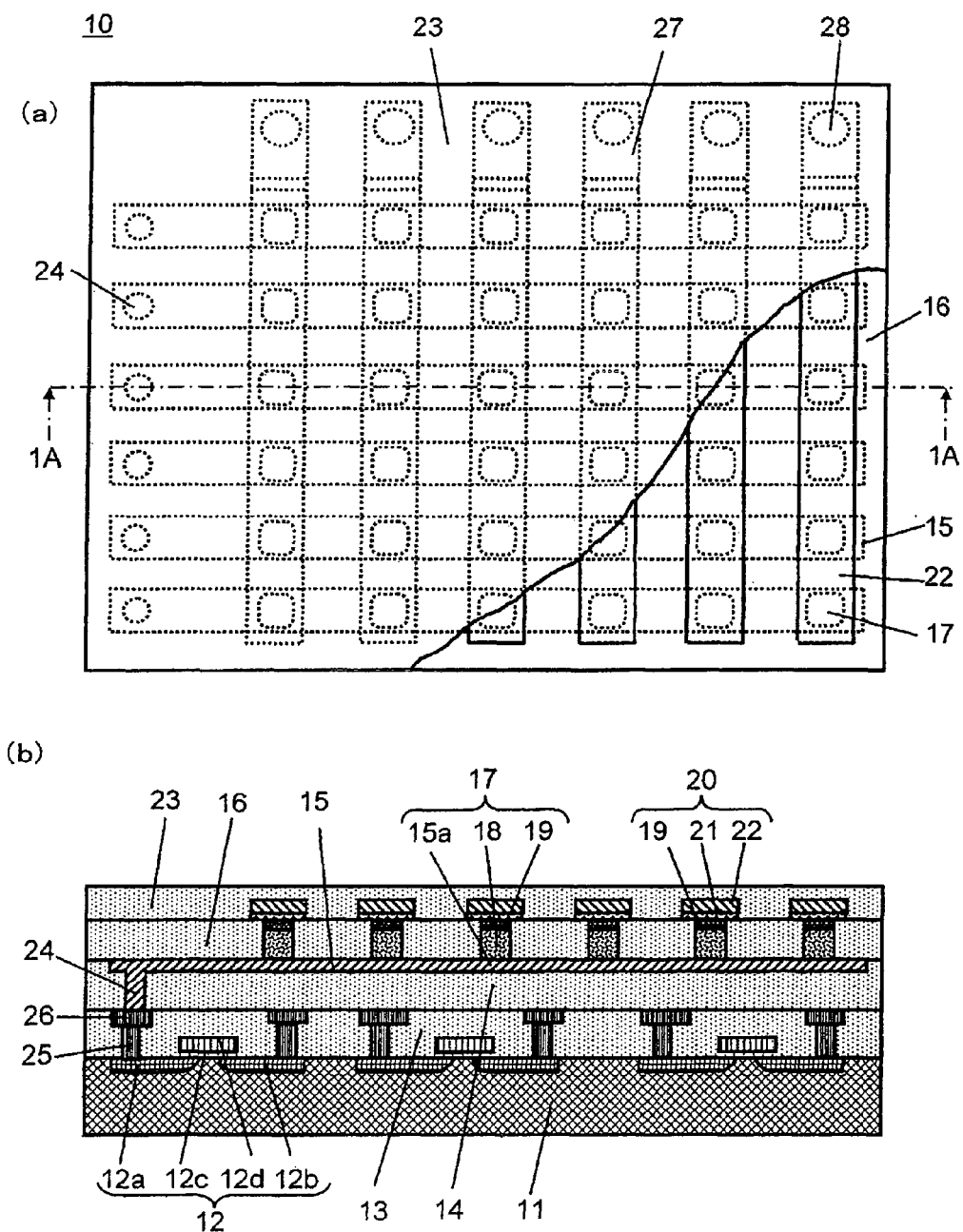
FIG. 1(a) is a plan view showing a configuration of a nonvolatile semiconductor memory apparatus according to Embodiment 1 of the present invention.
FIG. 1(b) is a cross-sectional view taken in the direction of arrows along line A-A.

DESCRIPTION OF REFERENCE NUMERALS 5 word line decoder
6 bit line decoder
7 readout circuit
10, 40, 70, 90, 100 nonvolatile semiconductor memory apparatus (ReRAM)
11 substrate
12 active element
12a source region
12b drain region
12c gate insulating film
12d gate electrode
13, 14 semiconductor interlayer insulating layer
15, 15a, 71, 91, 91a, 101, 101a lower-layer electrode wire
16, 30, 31, 92, 109 interlayer insulating layer
17 memory portion (first memory portion)
18, 76, 94, 104 resistance variable layer
19, 79, 95, 105 embedded electrode (metal electrode layer)
20 non-ohmic device (first non-ohmic device)
21, 34, 107 insulator layer
22, 35, 81, 99, 108 upper electrode
23 insulating protecting layer (first interlayer insulating layer)
24, 25, 28, 50, 51 embedded conductor
26 semiconductor electrode wire
27, 27a upper-layer electrode wire (first upper-layer electrode wire)
29 contact hole
30a first insulating layer
30b second insulating layer
32 groove
41 second memory portion (memory portion)
42 second resistance variable layer
43 second embedded electrode
44 second non-ohmic device (non-ohmic device)
45 second insulator layer
46 second upper electrode
47 second interlayer insulating layer
48 third interlayer insulating layer
49, 49a second upper-layer electrode wire
52 fourth interlayer insulating layer
53 third memory portion (memory portion)
54 third resistance variable layer
55 third embedded electrode
56 third non-ohmic device (non-ohmic device)
57 third insulator layer
58 third upper electrode
59 third upper-layer electrode wire
60 insulating protective layer
75 memory portion
72 lower wire
73, 73a, 77, 82 connection electrode
75, 93, 103 memory portion
78, 96, 106 non-ohmic device
80 semiconductor layer 97 p-type semiconductor layer
98 n-type semiconductor layer
110 upper-layer electrode wire
181 thin-film resistance layer
191, 351 thin-film electrode layer
341 thin-film insulating layer

BEST MODE FOR CARRYING OUT THE INVENTION

Hereinafter, preferred embodiments of the present invention will be described with reference to the drawings.

Hereinafter, embodiments of the present invention will be described with reference to the drawings. The same components or constituents are identified by the same reference numbers and will not be described repetitively in some cases. In addition, the shapes of transistors, memory portions and others are schematically shown and the numbers of them are set for easier illustration.

(Embodiment 1)

Figure 2:
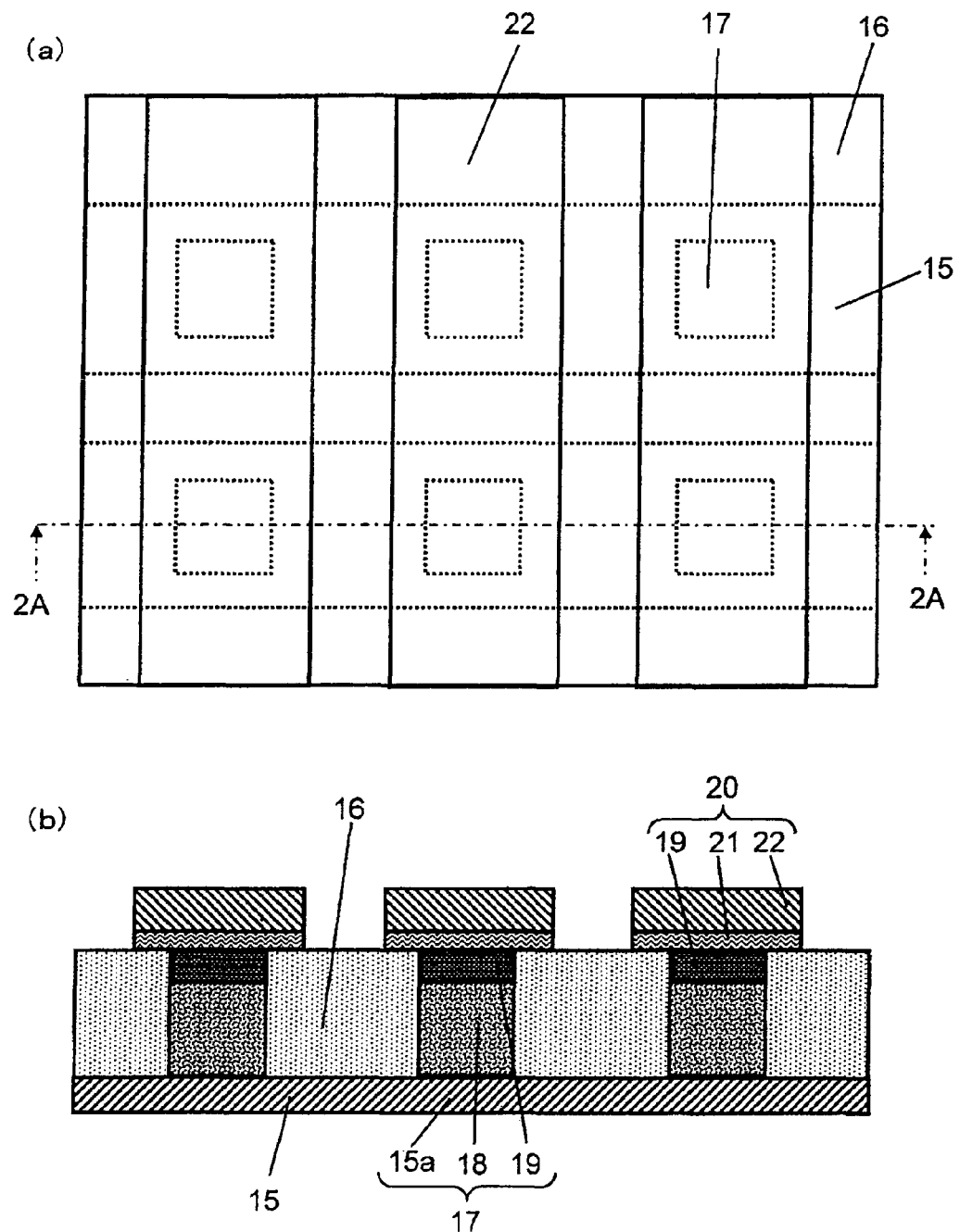
FIG. 2(a) is a partially enlarged plan view showing a configuration of memory portions and non-ohmic devices which are a major part of a nonvolatile semiconductor memory apparatus according to Embodiment 1.
FIG. 2(b) is a cross-sectional view taken in the direction of arrows along line 2A-2A.

FIG. 1 is a view showing a configuration of a nonvolatile semiconductor memory apparatus 10 according to Embodiment I of the present invention. FIG. 1(a) is a plan view. FIG. 1(b) is a cross-sectional view taken in the direction of arrows along line 1A-1A. In the plan view of FIG. 1(a), a part of an insulating protective film corresponding to an uppermost layer is illustrated as being cut away for easier understanding. FIG. 2 is a partially enlarged plan view of a major part of memory portions 17 and non-ohmic devices 20. FIG. 2(a) is a plan view. FIG. 2(b) is a cross-sectional view taken in the direction of arrows along line 2A-2A.

The nonvolatile semiconductor memory apparatus 10 of this embodiment comprises a substrate 11, stripe-shaped lower-layer electrode wires 15 provided on the substrate 11, an interlayer insulating layer 16 which is provided on the substrate 11 including the lower-layer electrode wires 15 and provided with contact holes at locations respectively opposite to the lower-layer electrode wires 15, resistance variable layers 18 which are respectively embedded to fill the contact holes and are respectively connected to the lower-layer electrode wires 15, and non-ohmic devices 20 are provided on the resistance variable layers 18 such that the non-ohmic devices 20 are respectively connected to the resistance variable layers 18.

In this embodiment, the non-ohmic device 20 is a MIM diode which has a laminated structure including three layers which are an embedded electrode 19 which is a metal electrode layer, an upper electrode, 22, and an insulator layer 21. One layer of the laminated structure, i.e., the embedded electrode 19 which is the metal electrode layer is embedded to fill the contact hole. The other layers of the laminated structure, i.e., the insulator layer 21 and the upper electrode 22 have a larger shape (area) than the opening of the contact hole and are provided on the interlayer insulating layer 16.

Furthermore, in this embodiment, the insulator layers 21 and the upper electrodes 22 are provided in strip-shape on the interlayer insulating layer so as to respectively cross the lower-layer electrode wires 15. Each upper electrode 22 forms a part of an upper-layer electrode wire. Memory portions 17 are each constituted by the resistance variable layer 18, a lower-layer electrode wire 15a connected to the resistance variable layer 18 and the embedded electrode 19 connected to the resistance variable layer 18. As the resistance variable layer 18, an oxide containing iron, for example, triiron tetroxide ($Fe_3O_4$) is desirably used to stabilize the resistance varying characteristics, obtain reproducibility in manufacturing, etc. The MIM diode which is the non-ohmic 20 is formed by a laminated structure of three layers which are the embedded electrode 19, the insulator layer 21, and the upper electrode 22. As shown in FIG. 1, the insulator layers 21 and the upper electrodes 22 are extended to outside the region where the memory portions 17 and the non-ohmic devices 20 are arranged in matrix. The upper electrodes 22 are connected to the upper-layer electrode wires 27 outside the matrix region. Within the matrix region, the upper electrodes 22 also serve as the upper-layer electrode wires.

In this embodiment, there is provided a semiconductor circuit in which active elements 12 such as transistors are integrated on a silicone single crystal substrate used as the substrate 11. Whereas the transistors each including the source region 12a, the drain region 12b, the gate insulating film 12c and the gate electrode 12d are shown as the active elements 12, elements generally required for the memory circuit such as DRAM are provided in addition to the active elements 12.

The lower-layer electrode wires 15 and the upper-layer electrode wires 27 are connected to the active elements 12 in regions different from the matrix region where the memory portions 17 and the non-ohmic devices 20 are arranged. To be specific, as shown in FIG. 1, the lower-layer electrode wire 15 is connected to the source region 12a of the active element 12 via the embedded conductors 24 and 25, and the semiconductor electrode wire 26. The upper-layer electrode wire 27 is connected to another active element (not shown) via the embedded conductor 28 in the same manner.

The lower-layer electrode wire 15 is formed by sputtering using, for example, Ti—Al—N alloy, Cu or Al and is easily formed by an exposure process and an etching process. The resistance variable layer 18 forming the memory portion 17 may be formed by sputtering or the like using a transition metal oxide such as a titanium oxide, a vanadium oxide, a cobalt oxide, a nickel oxide, a zinc oxide, or a niobium oxide, as well as a triiron tetroxide which is the iron oxide. Such a transition metal oxide material is allowed to have a specific resistance value when it is applied with a voltage or current having a threshold or higher and maintains the resistance value until it is newly applied with a pulse voltage or pulse current having a constant magnitude.

As the interlayer insulating layer 16, an insulating oxide material may be used. To be specific, a silicon oxide (SiO) deposited by the CVD process, TEOS-SiO layer deposited by the CVD process using ozone ($O_3$) and tetraethoxysilane (TEOS), or silicon nitride (SiN) layer may be used. Alternatively, silicon carbon nitride (SiCN) or silicon oxycarbite (SiOC) which is a low-dielectric constant material, or fluorine-doped silicon oxide (SiOF) may be used.

As the non-ohmic device 20, a MIM diode having a laminated structure in which the embedded electrode 19 and the upper electrode 22 made of, for example, tantalum (Ta), aluminum (Al) or a combination of these and the insulator layer 21 made of silicon nitride (SiN) may be used. As the electrode, Ti or Cr may be used, in addition to Al. If they are used, the wire resistance increases. Therefore, a laminated structure of thin films made of Al or Cu is desirably used.

Figure 3:
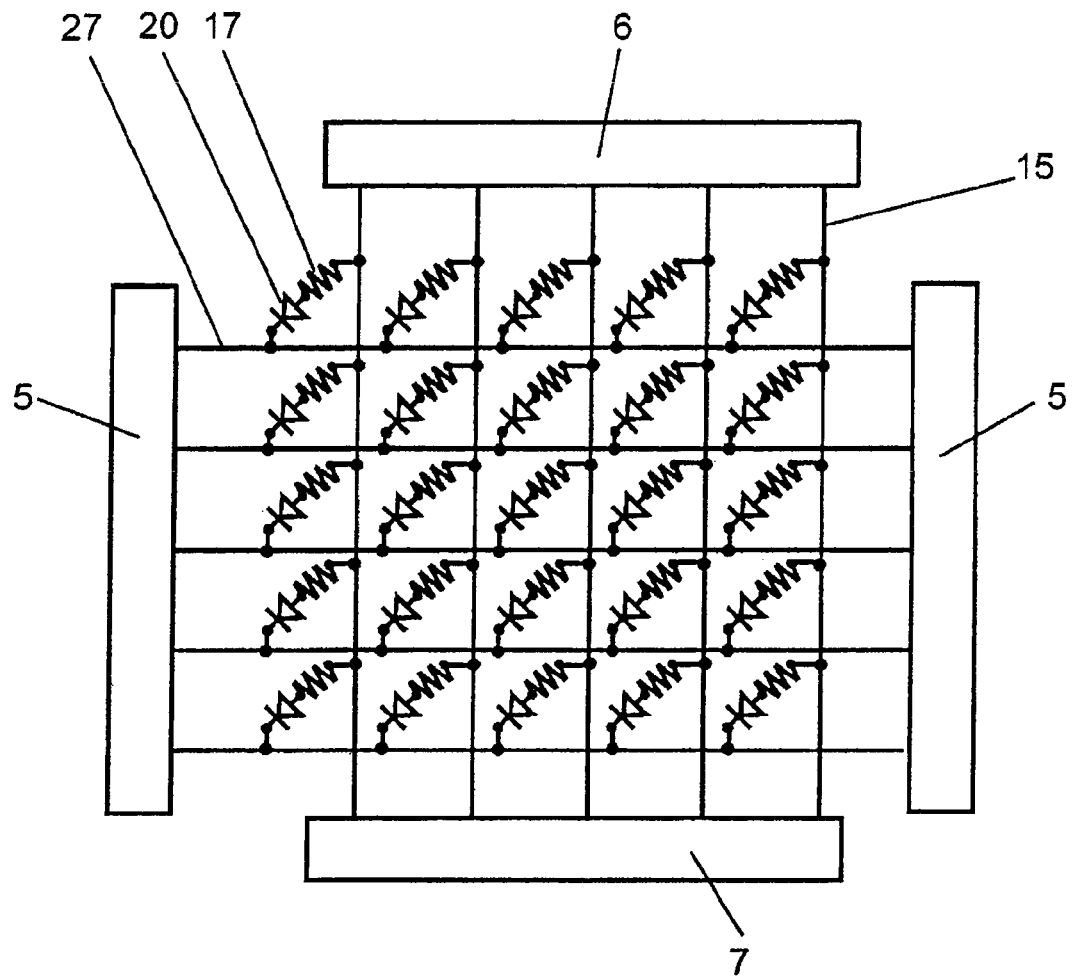
FIG. 3 is a block diagram schematically showing a circuit configuration of the nonvolatile semiconductor memory apparatus according to Embodiment 1.

FIG. 3 is a block diagram showing a schematic circuit configuration of the nonvolatile semiconductor memory apparatus 10 of this embodiment. As shown in FIG. 1, the memory portion 17 is connected in series with the non-ohmic device 20, one end of the memory portion 17 is connected to the lower-layer electrode wire 15, and one end of the non-ohmic device 20 is connected to the upper-layer electrode wire 27. The lower-layer electrode wire 15 is connected to a bit line decider 6 and to a readout circuit 7. The upper-layer electrode wire 27 is connected to a word line decoder 5. Thus, the lower-layer electrode wires 15 serve as bit lines and the upper-layer electrode wires 27 serve as word lines. The lower-layer electrode wires 15 and the upper-layer electrode wires 27 are arranged in matrix. The bit line decoder 6, the word line decoder 5, and the readout circuit 7 form peripheral circuits. The peripheral circuits include the active elements 12 constituted by, for example, MOSFET.

Subsequently, a manufacturing method of the nonvolatile semiconductor memory apparatus 10 of this embodiment will be described with reference to FIGS. 4 to 7.

Figure 4:
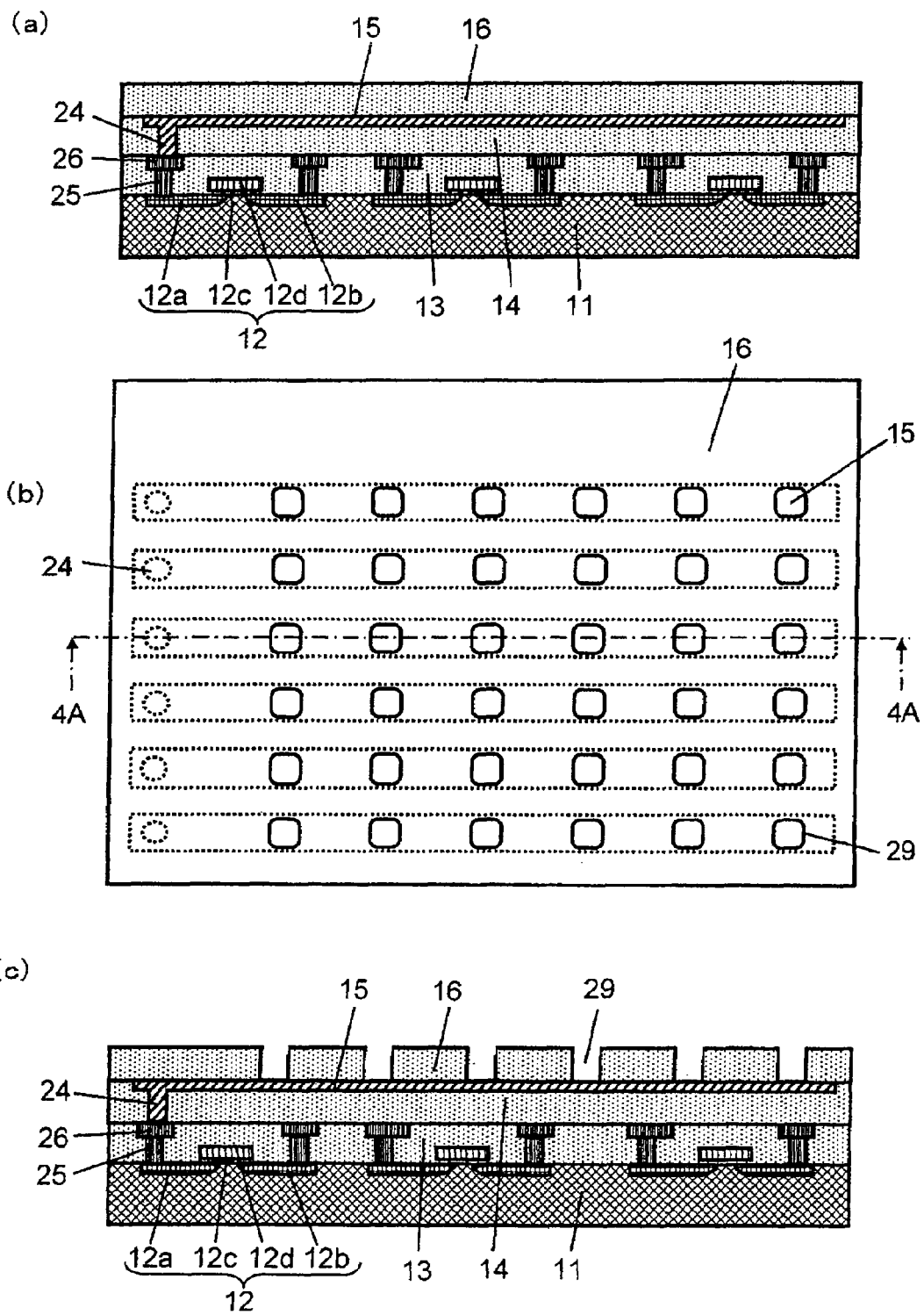
FIG. 4 is a view showing from the step for forming an interlayer insulating layer on a substrate provided with active elements to the step for forming contact holes in a manufacturing method of the nonvolatile semiconductor memory apparatus according to Embodiment 1.

FIG. 4 is a view showing from the step for forming constituents and the interlayer insulating layer 16 on the substrate 11 provided with active elements 12 to the step for forming contact holes 29. FIG. 4(*a*) is a cross-sectional view showing a state where the interlayer insulating layer 16 is formed. FIG. 4(*b*) is a plan view showing a state where contact holes 29 are formed. FIG. 4(*c*) is a cross-sectional view taken in the direction of arrows along line 4A-4A of FIG. 4(*b*). The cross-sections shown in FIGS. 5 to 10 are taken along line 4A-4A, including the cross-section of FIG. 4(*a*).

Figure 5:
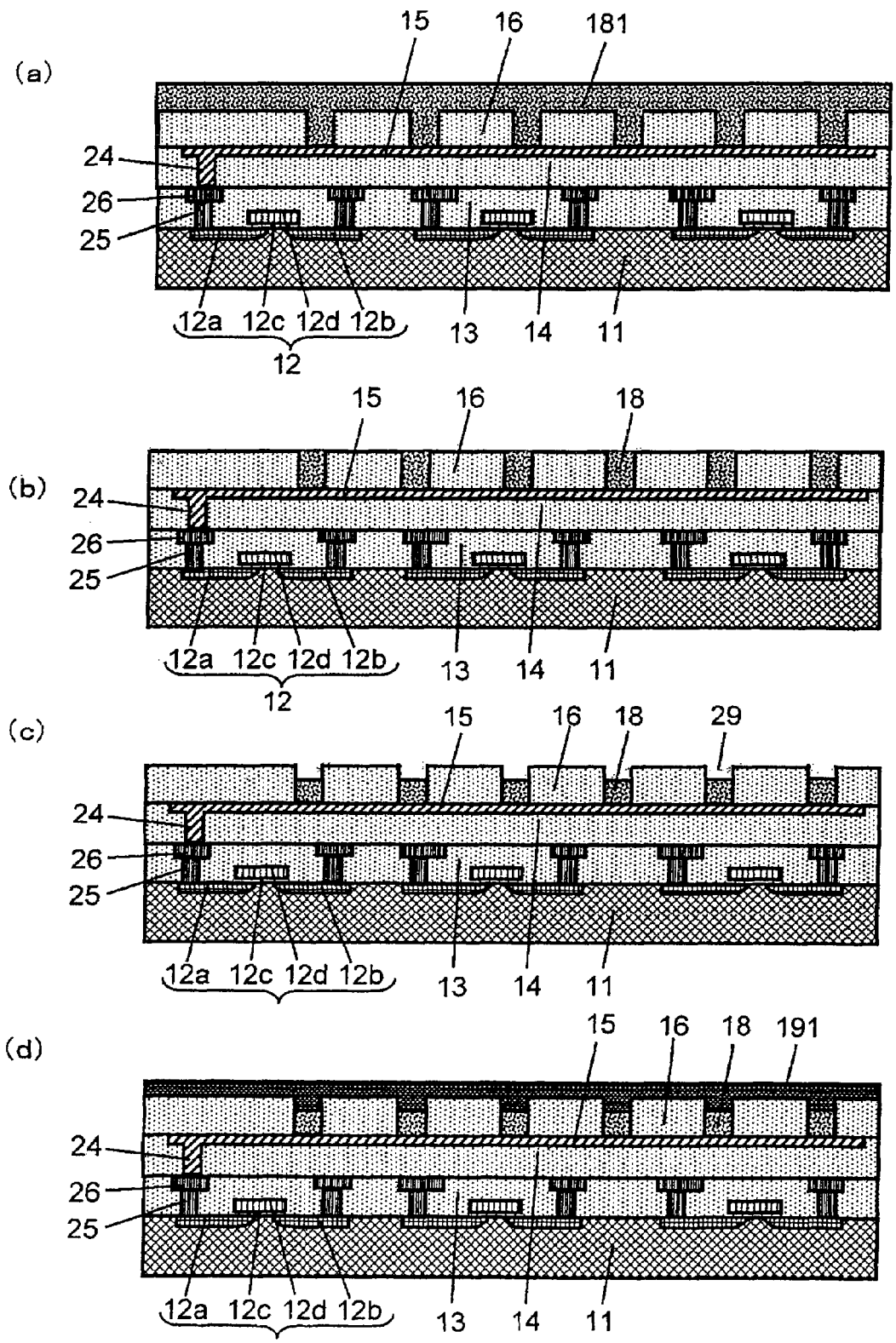
FIG. 5 is a view showing a step for embedding resistance variable layers and embedded electrodes to fill the contact holes in the manufacturing method of the nonvolatile semiconductor memory apparatus according to Embodiment 1.

FIG. 5 is a view showing a step for embedding resistance variable layers 18 and embedded electrodes 19 to fill the contact holes 29. FIG. 5(*a*) is a cross-sectional view showing a state where a thin-film resistance layer 181 which becomes the resistance variable layers is formed. FIG. 5(*b*) is a cross-sectional view showing a state where a portion of the thin-film resistance layer 181 on the interlayer insulating layer 16 is removed by CMP. FIG. 5(*c*) is a cross-sectional view showing a state where portions of the resistance variable layers 18 inside the contact holes 29 are removed by over-polishing. FIG. 5(*d*) is a cross-sectional view showing a state where a thin-film electrode layer 191 which becomes embedded electrodes 19 is formed.

Figure 6:
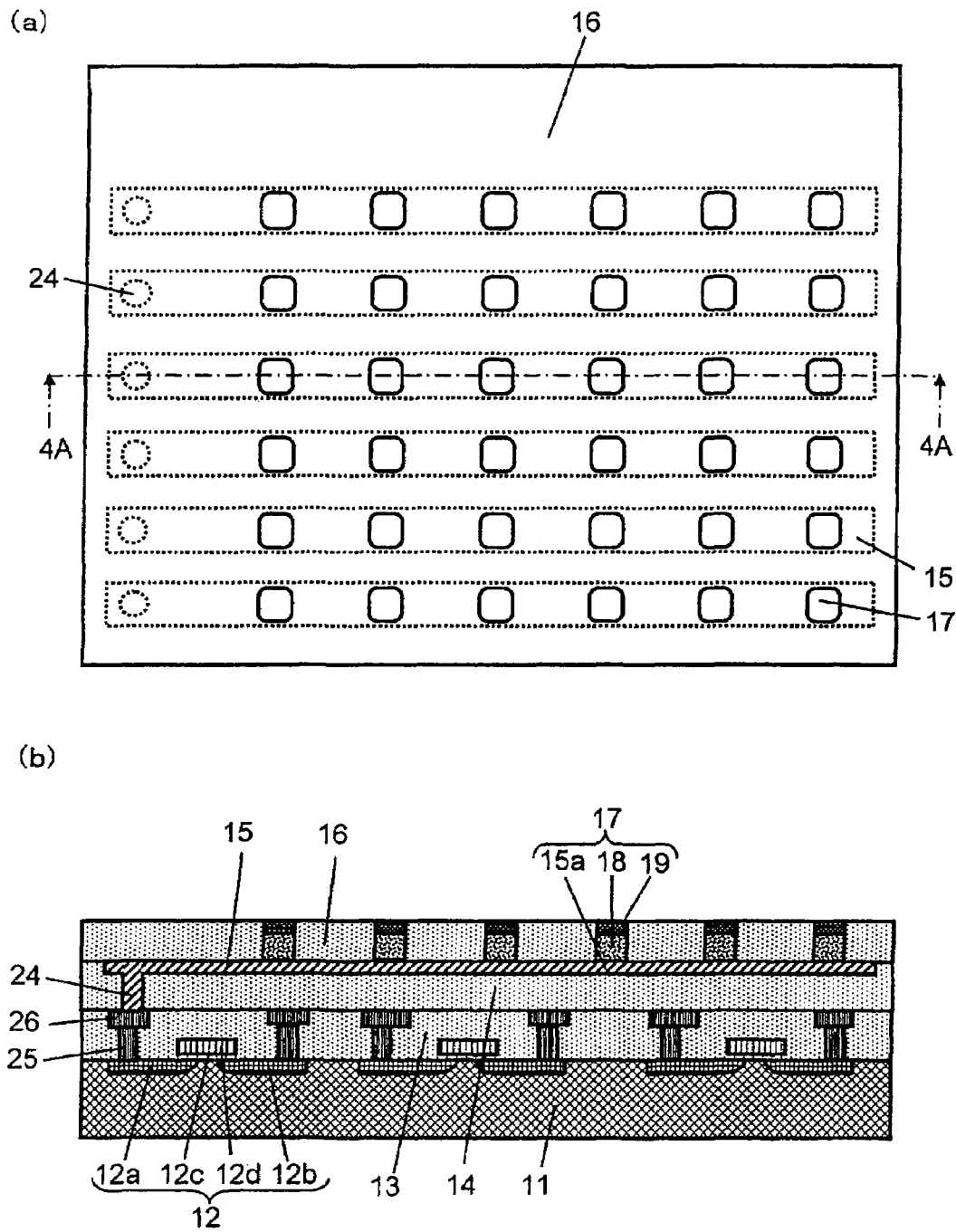
FIG. 6 is a view showing a state where resistance variable layers and embedded electrodes are embedded to fill the contact holes in the manufacturing method of the nonvolatile semiconductor memory apparatus according to Embodiment 1.

FIG. 6 is a view showing a state where the resistance variable layers 18 and the embedded electrodes 19 are embedded to fill the contact holes 29. FIG. 6(*a*) is a plan view. FIG. 6(*b*) is a cross-sectional view taken in the direction of arrows along line 4A-4A.

Figure 7:
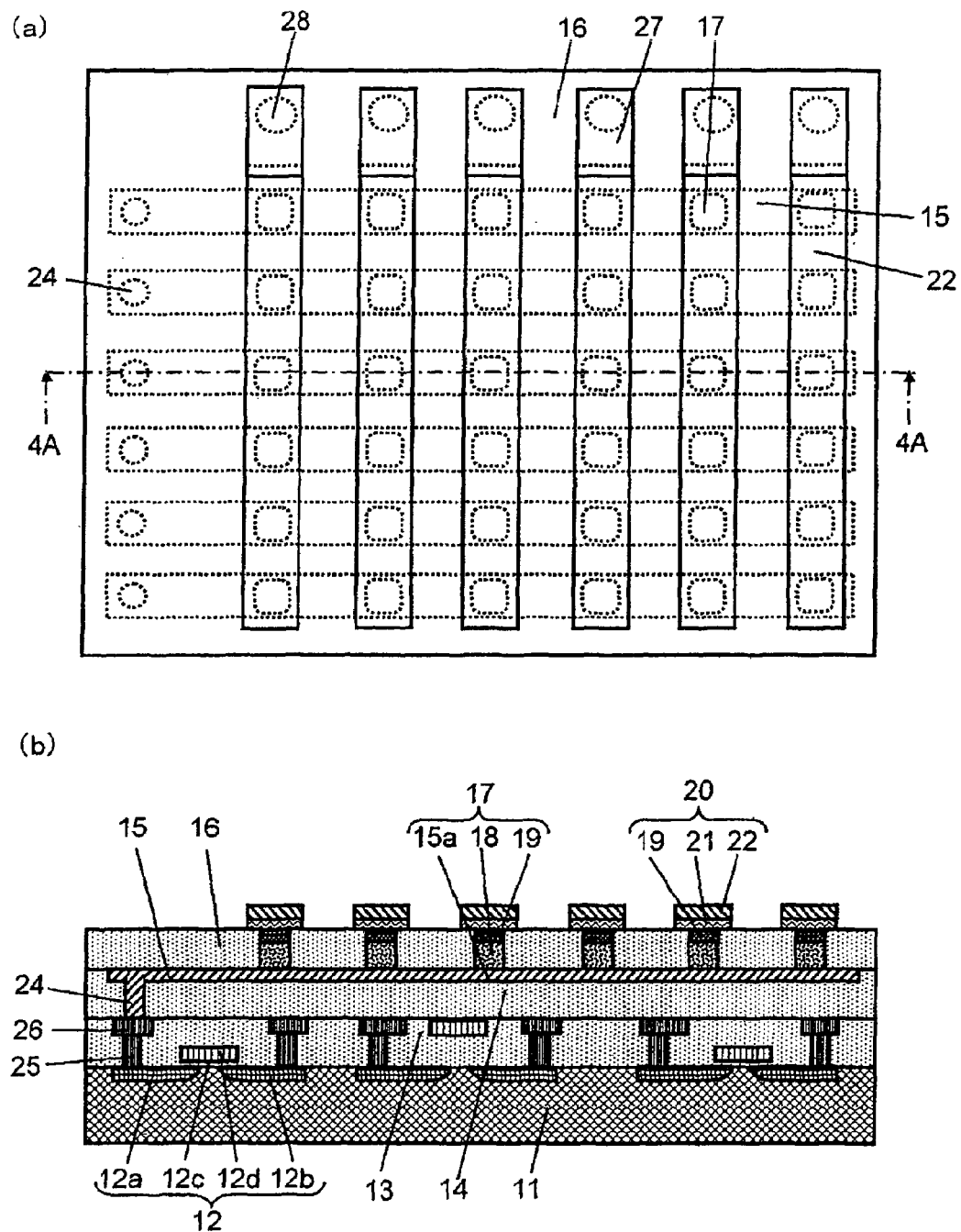
FIG. 7 is a view showing a state where insulator layers and upper electrodes are formed in the manufacturing method of the nonvolatile semiconductor memory apparatus according to Embodiment 1.

FIG. 7 is a view showing a state where the insulator layers 21 and the upper electrodes 22 are formed. FIG. 7(*a*) is a plan view and FIG. 7(*b*) is a cross-sectional view.

Initially, as shown in FIG. 4(*a*), on the substrate 11 provided with a plurality of active elements 12, semiconductor electrode wires 26 and semiconductor interlayer insulating layers 13 and 14, the lower-layer electrode wires 15 and the interlayer insulating layer 16 are formed. Aluminum was usually used for the semiconductor electrode wires 26, but in recent years, cupper which attains low-resistance state even in a miniaturized structure is primarily used. For the semiconductor interlayer insulating layers 13 and 14, a fluorine-containing oxide (e.g., SiOF), a carbon-containing nitride (e.g., SiCN) or an organic resin material (e.g., polyimide) is used to reduce a parasitic capacitance between the wires. In this embodiment, for the semiconductor electrode wires 26, for example, cupper may be used, and for the semiconductor interlayer insulating layers 13 and 14, for example, a fluorine-containing oxide SiOF my be used.

The lower-layer electrode wires 15 are embedded in the semiconductor interlayer insulating layer 14. They are formed in a manner described below. To be specific, stripe-shaped grooves for embedding the lower-layer electrode wires 15 and contact holes connected with the semiconductor electrode wires 26 are formed in the semiconductor insulating layer 14. They can be easily formed using a technique used in a general semiconductor process. After the grooves and the contact holes are formed, the electric conductor film which becomes the lower-layer electrode wires 15 is formed. Then, by conducting, for example, CMP, the lower-layer electrode wires 15 having the shape shown in FIG. 4(*a*) are formed. As the lower-layer electrode wires 15, for example, Cu, Al, Ti—Al alloy or a laminated structure of these may be used, other than above described Ti—Al—N alloy.

Then, as shown in FIG. 4(*a*), on the substrate 11 including the lower-layer electrode wires 15, the interlayer insulting layer 16 made of TEOS-SiO is deposited using, for example, the CVD process. For the interlayer insulating layer 16, various materials may be used as described above.

Then, as shown in FIGS. 4(*b*) and 4(*c*), the contact holes 29 are formed at constant arrangement pitches in the interlayer insulating layer 16 on the lower-layer electrode wires 15. The contact holes 29 have an outer shape which is smaller than the width of the lower-layer electrode wires 15, as can be seen from FIG. 4(*b*). The contact holes 29 have a quadrangular shape as shown in FIG. 4, but may be a circular shape, an oval shape, or other shape. The contact holes 29 are formed by a general semiconductor process, and detail explanation thereof is omitted.

Then, as shown in FIG. 5(*a*), on the interlayer insulating layer 16 including the contact holes 29, a thin-film resistance layer 181 (first deposited film) which becomes the resistance variable layers 18 is formed. In this embodiment, the thin-film resistance layer 181 is formed in such a manner that $Fe_3O_4$ which is the material for the resistance variable layers 18 is deposited into the contact holes 29 and on the interlayer insulating layer 16 by the sputtering process. As the film forming method, the CVD process or an ALD process may be used, instead of the sputtering process.

Then, as shown in FIG. 5(*b*), only a portion of the thin-film resistance layer 181 which covers the surface of the interlayer insulating layer 16 is removed using the CMP process, embedding the resistance variable layers 18 to fill the contact holes 29.

Then, as shown in FIG. 5(*c*), by further conducting the over-polishing, portions of the resistance variable layers 18 inside the contact holes 29 are removed. As a result, as shown in FIG. 5(*c*), recesses are formed by the contact holes 29 and the resistance variable layers 18 (remaining portions of the first deposited film). Using the over-polishing technique of the CMP, the portions of the resistance variable layers 18 can be removed to a depth (recess depth) of the contact holes 29 into which a polishing pad of the CMP intrudes. The use of the over-polishing technique of the CMP favorably facilitates the depth control for the recesses.

As the method of removing the portions of the resistance variable layers 18, the resistance variable layers 18 may be etched back instead of the over-polishing.

Then, as shown in FIG. 5(*d*), a thin-film electrode layer 191 (second deposited film) which becomes the embedded electrodes 19 is formed on the interlayer insulating layer 16 including the contact holes 29 (recesses). In this embodiment, the thin-film electrode layer 191 becomes a part of the memory portions 17 and a part of the non-ohmic devices 20. As the material for the thin-film electrode layer 191, Al which is the material for a part of the memory portions 17 and a part of the ohmic devices 20 was used. The AL material for the thin-film electrode layer 191 is deposited inside the recesses and on the interlayer insulating layer 16 as shown in FIG. 5(*d*).

Then, as shown in FIG. 6, only a portion of the thin-film electrode layer 191 covering the surface of the interlayer insulating layer 16 is removed by using the CMP process, embedding the embedded electrodes 19 to fill the contact holes 29.

Then, as shown in FIG. 7, the insulator layers 21 and the upper electrodes 22 are deposited such that they are connected to the embedded electrodes 19. In this case, the insulator layers 21 and the upper electrodes 22 are formed in stripe shape on the interlayer insulating layer 16 such that the insulator layers 21 and the upper electrodes 22 have a larger shape (area) than at least the openings of the contact holes 29 and respectively cross the lower-layer electrode wires 15. In this embodiment, aluminum (Al) was used for the embedded electrodes 19 and the upper electrodes 22, and SiN was used for the insulator layers 21. SiN is easily formed by the sputtering process to make a thin film which is favorable in insulation property and highly dense. A current (I) flowing in the MIM diode which is the non-ohmic device 20 formed in this way is derived from the formula (1). The following formula (1) is established even when using a metal-semiconductor-metal (MSM) diode as described later (Embodiment 3). Herein, the detail description for the case of using the MSM diode will be omitted.

$$I = S \cdot \alpha \cdot V \cdot \exp(\beta \cdot \sqrt{V}) \qquad (1)$$

herein, $\alpha = (n \cdot \mu \cdot q \cdot d) \exp(-E/kT)$ $\beta = (1/kT) \cdot \sqrt{(q^3/(x \cdot \epsilon_0 \cdot \epsilon_{opt} \cdot d))}$ In the formula (1), S is the area of the MIM diode (or area of MSM diode), n is a carrier density, $\mu$ is a mobility, q is an electric charge of electrons, d is the thickness of the insulator layer (thickness of the semiconductor layer in the case of the MSM diode), E is a trap depth, k is a Boltzmann constant, T is an absolute temperature, $\epsilon_0$ is the permittivity of vacuum, $\epsilon_{opt}$ is an optical dielectric constant of the insulator layer (semiconductor layer in the case of the MSM diode).

As should be understood from the formula (1), the current flowing in the MIM diode is proportional to the area of the MIM diode. Also, the current is more difficult to flow as the thickness of the insulator layer 21 increases. Accordingly, in order to obtain a large current capacity with a low voltage, the insulator layer 21 is required to be thinned. However, in the conventional structure for embedding the entire of the resistance variable layer and the entire of the non-ohmic device to fill the contact hole, pressure resistance of the insulator layer 21 may in some cases reduce if the insulator layer 21 is thinned.

It is considered that, in the conventional manufacturing method of the MIM diode (see e.g., U.S. Pat. Nos. 6,034,882 and U.S. Pat. No. 7,265,000), if the insulator layer 21 is formed to be thinner, the upper and lower electrodes of the MIM diode tend to contact each other due to adhesion of the electrode material in an outer peripheral region of the insulator layer in the process for manufacturing the MIM diode and therefore, leak tends to occur. That is, according to these publications, the memory plugs containing the MIM diodes are manufactured by entirely removing the multi-layer film formed in a solid state using a suitable mask. Therefore, there is a likelihood that the upper and lower electrodes of the MIM diode electrically contact each other due to adhesion of the electrode material removed from the multi-layer film to the MIM diode, if the insulator layer 21 is formed to be thinner in the conventional manufacturing method of the MIM diode.

In contrast, in this embodiment, as shown in FIG. 6, the embedded electrodes 19 are entirely embedded to fill the contact holes 29, and the surfaces thereof are smoothed to a great degree by conducting the CMP. When the insulator layers 21 are formed on the flattened surfaces, they are dense and continuous even if the thickness of them is smaller. Therefore, the pressure resistance of the insulator layers 21 can be secured properly even if the insulator layers 21 are formed to be thinner. In addition, since the embedded electrodes 19 are entirely covered with the insulator layers 21, an event that the embedded electrode 19 and the upper electrode 22 contact and leak occurs in the outer peripheral region of the insulator layer 21 does not take place. Furthermore, since the upper electrode 22 is provided to extend to a surrounding region of the embedded electrode 19, the current pulse flowing in the non-ohmic device is formed to spread to outside the area of the embedded electrode. In this case, since an electric force line based on an electric field spreads in the direction from the embedded electrode 19 inside the contact hole 29 to the insulator layer 21, an effective area of the MIM diode is larger than the area of the conventional MIM diode whose layers are all filled in the contact hole. Therefore, the non-ohmic device 20 which has a larger current capacity and less variation in properties than the conventional element is attainable.

The upper-layer electrode wires 27 are connected to the upper electrodes 22 outside the region where the memory portions 17 and the MIM diodes which are the non-ohmic devices 20 are arranged in matrix. For the upper-layer electrode wires 27, the material similar to that for the lower-layer electrode wires 15 may be used. The embedded conductors 28 are formed at the same time that the upper-layer electrode wires 27 are formed. The upper-layer electrode wires 27 are connected to the semiconductor electrode wires (not shown) via the embedded conductors 28 and electrically connected to the active elements provided at locations which are not shown.

Thereafter, the insulating protective layer 23 is formed to cover the upper electrodes 22 and the upper-layer electrode wires 27, thereby manufacturing the nonvolatile semiconductor memory apparatus 10 as shown in FIG. 1.

Having described an example in which the MIM diode includes SiN as the insulator layer 21 in this embodiment, the present invention is not limited to this. For example, tantalum oxide (TaO), alumina (AlO), or titania (TiO) may be used. In the case of using TaO, TaO may be formed in any method. For example, TaO may be formed by a dry heat oxidation process, a wet heat oxidation process, or a plasma oxidation process after a Ta film is formed, or otherwise TaOx film may be directly formed by a reactive sputtering process, etc.

Figure 8:
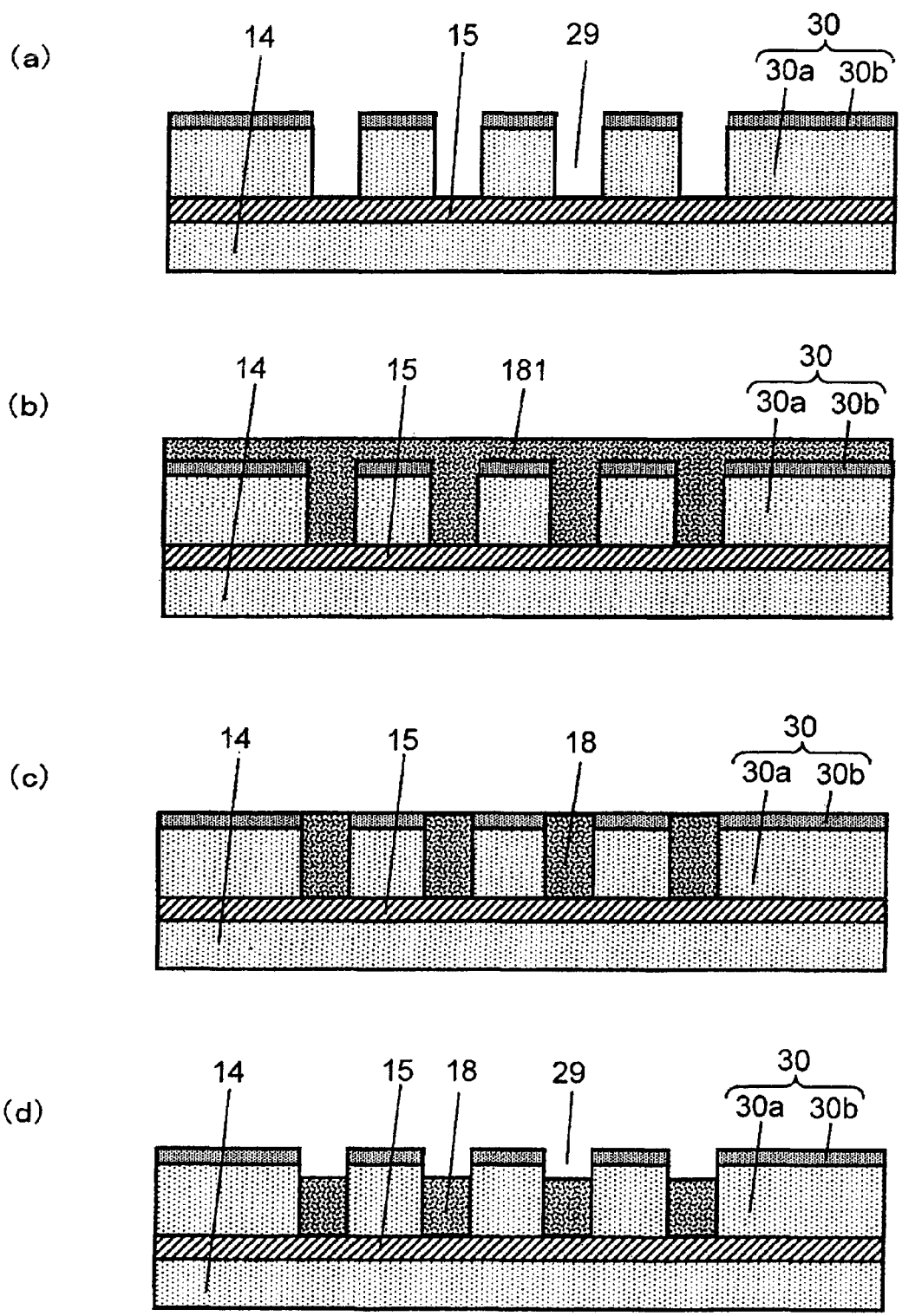
FIG. 8 is a view showing a manufacturing method according to Modification of the nonvolatile semiconductor memory apparatus according to Embodiment 1, showing a step for embedding resistance variable layers to fill the contact holes provided in the interlayer insulating layer.
Figure 9:
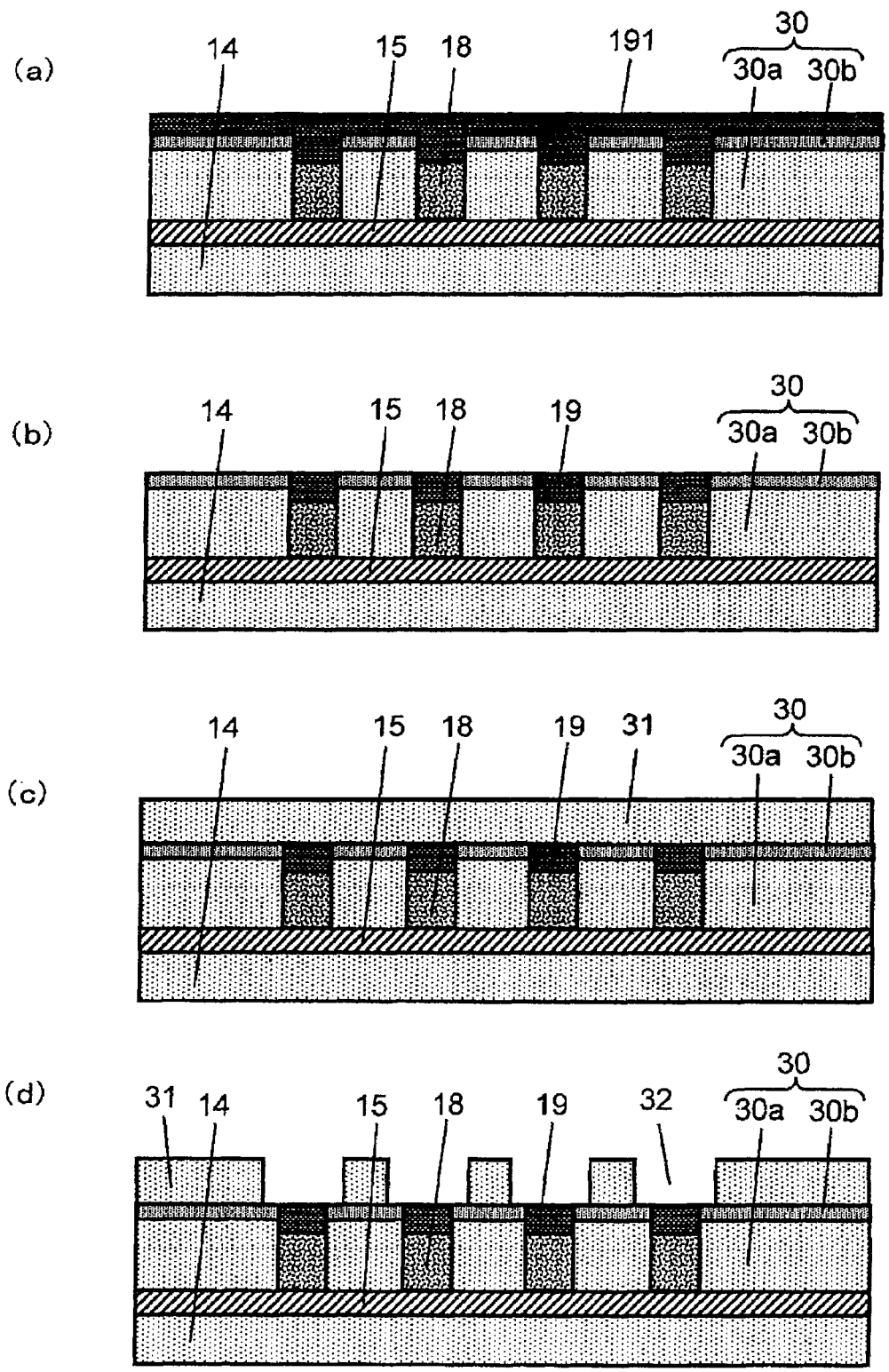
FIG. 9 is a view showing a manufacturing method of a nonvolatile semiconductor memory apparatus according to Modification of Embodiment 1, showing from the step for embedding the resistance variable layers and the embedded electrodes to fill the contact holes to the step for forming grooves for embedding the insulator layers and the upper electrodes in the interlayer insulating layer.
Figure 10:
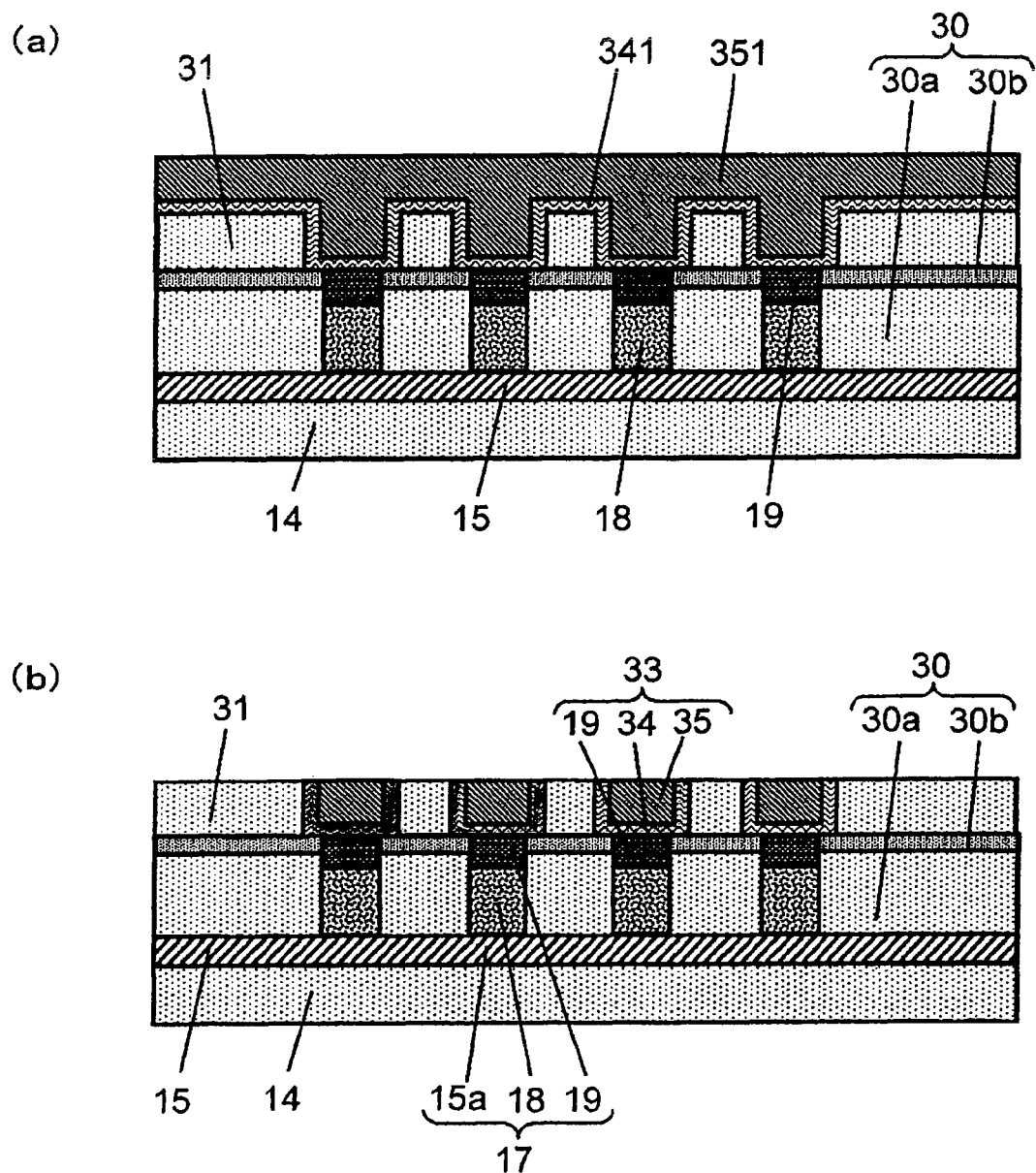
FIG. 10 is a view showing a manufacturing method according to Modification of the nonvolatile semiconductor memory apparatus according to Embodiment 1, showing a step for embedding the insulator layers and the upper electrodes to fill the grooves.

Subsequently, a manufacturing method of modification of this embodiment will be described with reference to FIGS. 8 to 10. As shown in FIGS. 8 to 10, only the interlayer insulating layer 14 and constituents located thereabove are illustrated for the sake of simplified illustration.

FIG. 8 is a view showing steps for embedding resistance variable layers to fill the contact holes 29 provided in the interlayer insulating layer 30. FIG. 8($a$) is a cross-sectional view showing a state where the contact holes 29 are formed. FIG. 8($b$) is a cross-sectional view showing a state where a thin-film resistance layer 181 which becomes the resistance variable layers 18 is formed. FIG. 8($c$) is a cross-sectional view showing a state where a portion of the thin-film resistance layer 181 on the interlayer insulating layer 30 is removed. FIG. 8($d$) is a cross-sectional view showing a state where portions of the resistance variable layers 18 inside the contact holes 29 are further removed by over-polishing.

FIG. 9 is a view showing from the step for embedding the resistance variable layers 18 and the embedded electrodes 19 to fill the contact holes 29 to the step for forming grooves 32 for embedding insulator layers 34 and the upper electrodes 35 in the interlayer insulating layer 31. FIG. 9($a$) is a view showing a state where a thin-film electrode layer 191 which becomes the embedded electrode layers 19 is formed. FIG.

9(b) is a cross-sectional view showing a state where a portion of the thin-film electrode layer 191 on an interlayer insulating layer 30 is removed by the CMP. FIG. 9(c) is a cross-sectional view showing a state where an interlayer insulating layer 31 is formed. FIG. 9(d) is a cross-sectional view showing a state where the grooves 32 are formed in the interlayer insulating layer 31.

FIG. 10 is a view showing a step for embedding the insulator layers 34 and the upper electrodes 35 to fill the grooves 32. FIG. 10(a) is a cross-sectional view showing a state where a thin-film insulating layer 341 which becomes the insulator layers 34 and a thin-film electrode layer 351 which becomes the upper electrodes 35 are formed on the interlayer insulating layer 31 including the grooves 32. FIG. 10(b) is a cross-sectional view showing a state where portions of the thin-film electrode layer 351 and the thin-film insulating layer 341 on the interlayer insulating layer 31 are removed and portions thereof are embedded to fill the grooves 32.

Initially, as shown in FIG. 8(a), on the substrate (not shown) including the lower-layer electrode wires 15, a first insulating layer 30a made of TEOS-SiO and a second insulating layer 30b made of, for example, SiON which is harder than TEOS-SiO, are deposited, using, for example, the CVD process. The first insulating layer 30a and the second insulating layer 30b form the interlayer insulating layer 30. The second insulating layer 30b serves as a stopper in the CMP process. By forming the second insulating layers 30b, the CMP process is easily and surely conducted. Then, the contact holes 29 are formed at constant arrangement pitches in the interlayer insulating layer 30 on the lower-layer electrode wires 15. The contact holes 29 have an outer shape smaller than the width of the lower-layer electrode wires 15, and are formed as in the manufacturing steps shown in FIGS. 4 to 7 and to have a shape as shown in FIGS. 4 to 7.

Then, as shown in FIG. 8(b), on the interlayer insulating layer 30 including the contact holes 29, the thin-film resistance layer 181 (first deposited film)which becomes the resistance variable layers 18 is formed. In this embodiment, as the resistance variable layers 18, $Fe_3O_4$ was deposited by the sputtering process. As the film forming method, the CVD process or the ALD process may be used, instead of the sputtering.

Then, as shown in FIG. 8(c), using the CMP process, a portion of the thin-film resistance layer 181 on the interlayer insulating layer 30 is removed, embedding resistance variable layers 18 to fill the contact holes 29. In this case, since the second insulating layer 30b included in the interlayer insulating layer 30 effectively serves as the stopper, only the thin-film resistance layer 181 can be surely removed without substantially polishing the interlayer insulating layer 30.

Then, as shown in FIG. 8(d), by conducting over-polishing, portions of the resistance variable layers 18 inside the contact holes 18 are removed. During the over-polishing, the interlayer insulating layer 30 is not subjected to polishing because of the presence of the second insulating layer 30b. Alternatively, the portions of the resistance variable layers 18 may be removed by etch back instead of the over-polishing.

Then, as shown in FIG. 9(a), on the interlayer insulating layer 30 including the contact holes 29, the thin-film electrode layer 191 (second deposited film) which becomes the embedded electrodes 19 is formed. The thin-film electrode layer 191 becomes a part of the memory portions 17 and a part of the non-ohmic devices 20 and is made of Al.

Then, as shown in FIG. 9(b), a portion of the thin-film electrode layer 191 on the interlayer insulating layer 30 is removed by the CMP process, embedding embedded electrodes 19 to fill the contact holes 29. In this case, also, since the second insulating layer 30b included in the interlayer insulating layer 30 effectively serves as the stopper, only the thin-film electrode layer 191 can be surely removed without substantially polishing the interlayer insulating layer 30.

Then, as shown in FIG. 9(c), on the interlayer insulating layer 30 including the embedded electrodes 19, the interlayer insulating layer 31 is further formed. The interlayer insulating layer 31 is formed to have a thickness required to embed the insulator layers 34 and the upper electrodes 35. As a material for the interlayer insulating layer 3, TEOS-SiO may be used. Alternatively, other interlayer insulating materials which are generally used in the semiconductor apparatuses may be used for the interlayer insulating layer 31. Furthermore, as in the interlayer insulating layer 30, the interlayer insulating layer 31 may have a double-layer structure including a hard insulating layer formed as the upper layer.

Then, as shown in FIG. 9(d), stripe-shaped grooves 32 are formed such that the embedded electrodes 19 are exposed and the grooves 32 respectively cross the lower-layer electrode wires 15. The process can be carried out using a general semiconductor process, for example, dry etching.

Then, as shown in FIG. 10(a), on the interlayer insulating layer 31 including the grooves 32, the thin-film insulating later 341 which becomes the insulator layers 34 and the thin-film electrode layer 351 which becomes the upper electrodes 35 are formed. As the materials for the thin-film insulating layer 341 and the thin-film electrode layer 351, the materials described in this embodiment may be used.

Then, as shown in FIG. 10(b), portions of the thin-film electrode layer 351 and the thin-film insulator layer 341 on the interlayer insulating layer 31 are removed by the CMP process, embedding the insulator layers 34 and the upper electrodes 35 to fill the grooves 32. Through this step, the memory portions 17 are each formed to include the resistance variable layer 18, and the lower-layer electrode wire 15a and the embedded electrode 19 sandwiching the resistance variable layer 18, while the non-ohmic devices 33 are each formed to include the embedded electrode 19, the insulator layer 34 and the upper electrode 35. Further, thereafter, the insulating protective layer (not shown) for protecting the upper electrodes is formed. In this manner, the nonvolatile semiconductor memory apparatus according to the manufacturing method of modification of this embodiment is manufactured.

In the nonvolatile semiconductor memory apparatus manufactured by the above described manufacturing method, the insulator layers 34 and the upper electrodes 35 are embedded in the interlayer insulating layer 31. Therefore, in the case where the memory portions 17 and the non-ohmic devices 33 are further laminated, the laminating steps therefor are easily carried out.

In the nonvolatile semiconductor memory apparatus of this modification, as shown in FIG. 10(b), the insulator layer 34 having a substantially U-shaped cross section is provided to cover the lower surface and both side surfaces of each upper electrode 35. For this reason, there is an advantage that the insulator layer 34 can serve as a barrier film depending on the selection of the insulating material for the interlayer insulating layer 31 or the metal material for the upper electrode 35.

(Embodiment 2)

Figure 11:
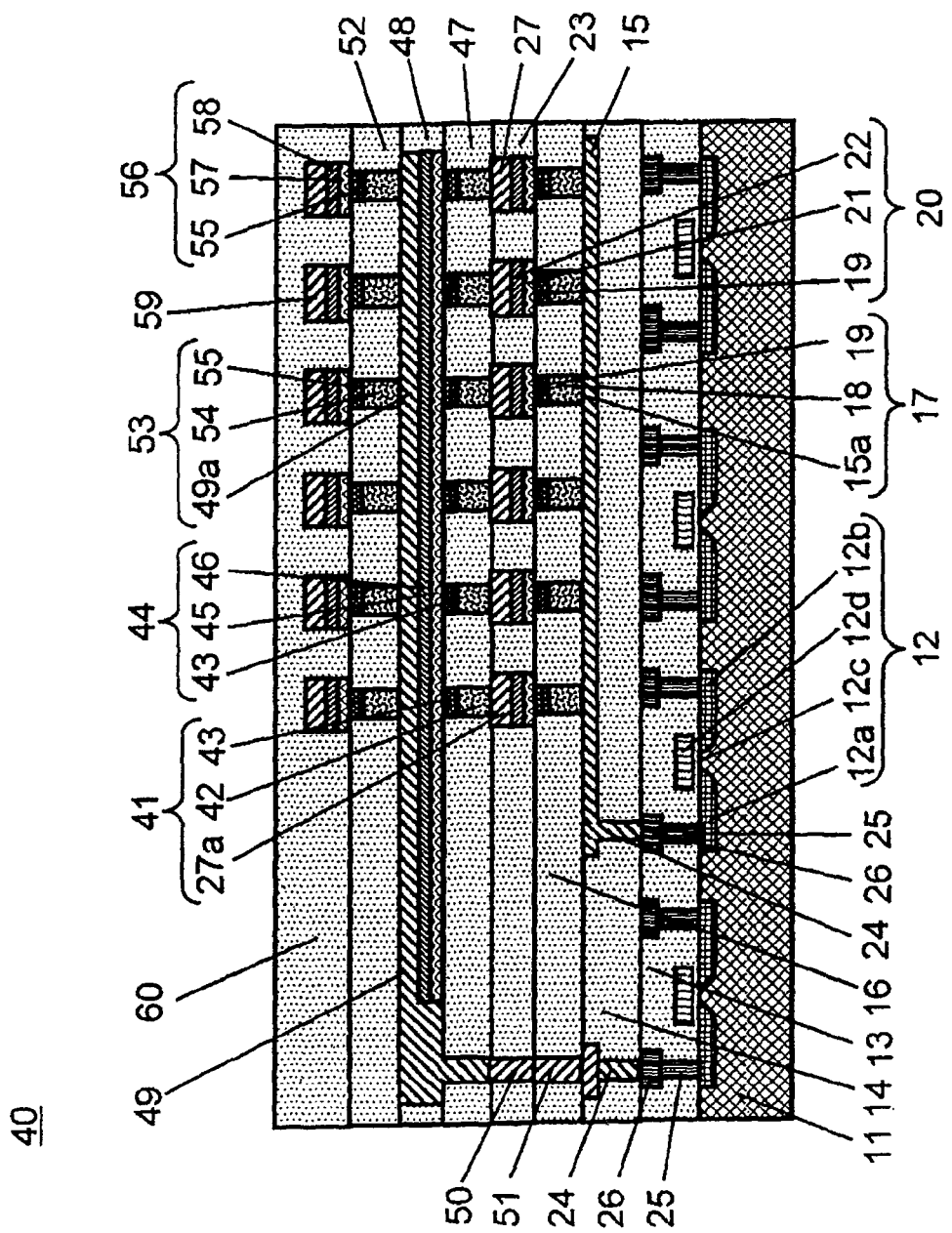
FIG. 11 is a cross-sectional view showing a configuration of a nonvolatile semiconductor memory apparatus according to Embodiment 2 of the present invention.

FIG. 11 is a cross-sectional view showing a configuration of a nonvolatile semiconductor memory apparatus 40 according to Embodiment 2 of the present invention. The nonvolatile semiconductor memory apparatus 40 has a configuration in which on a base structure which is the nonvolatile semiconductor memory apparatus 10 of Embodiment 1 shown in FIG. 1, two layers of a constituent unit including the interlayer insulating layer, the resistance variable layers and the non-ohmic devices which are embedded to fill the contact holes formed in the interlayer insulating layer, are stacked on the base structure to form a layered structure. Such a layered structure can attain a nonvolatile semiconductor memory apparatus with a larger capacity.

Hereinafter, the configuration of the nonvolatile semiconductor memory apparatus 40 of this embodiment will be described. In the nonvolatile semiconductor memory apparatus 10 shown in FIG. 1, the insulator layers 21 and the upper electrodes 22 are connected to the upper-layer electrode wires 27 outside the region where the memory portions 17 and the non-ohmic devices 20 are arranged in matrix. On the other hand, in the nonvolatile semiconductor memory apparatus 40 of this embodiment, the upper-layer electrode wires 27 are extended to a region above the upper electrodes 22 within the matrix region, which occurs also in the second and third stages. In the nonvolatile semiconductor memory apparatus 40, the memory portions and the non-ohmic devices are respectively stacked in three stages. To easily understand the constituents in the first, second, and third stages, the constituents in the first stage are expressed as first constituents, the constituents in the second stage are expressed as second constituents, and the constituents in the third stage are expressed as third constituents.

On the first interlayer insulating layer 23 including the first upper-layer electrode wires 27, a second interlayer insulating layer 47 is further provided. The second interlayer insulating layer 47 is provided with contact holes at locations respectively corresponding to the first memory portions 17. Second resistance variable layers 42 and second embedded electrodes 43 are embedded to fill the contact holes. Second insulator layers 45, second upper electrodes 46, and second upper-layer electrode wires 49 are provided in stripe shape such that they are respectively connected to the second embedded electrodes 43 and respectively cross the first upper-layer electrode wires 27. Further, a third interlayer insulating layer 48 is provided so that these constituents are embedded therein.

On the second upper-layer electrode wires 49 and the third interlayer insulating layer 48, a fourth interlayer insulating layer 52 is provided. The fourth interlayer insulating layer 52 is provided with contact holes at locations respectively corresponding to the first memory portions 17 and the second memory portions 41. Third resistance variable layers 54 and third embedded electrodes 55 are embedded to fill the contact holes. Third insulator layers 57, third upper electrodes 58, and third upper-layer electrode wires 59 are provided in stripe shape such that they are respectively connected to the third embedded electrodes 55 and respectively cross the second upper-layer electrode wires 49. Further, an insulating protecting layer 60 is provided so that these constituents are embedded therein and protected.

The second memory portions 41 are each constituted by the second resistance variable layer 42, a first upper-layer electrode wire 27*a* and the second embedded electrode 43 sandwiching the second resistance variable layer 42. The second non-ohmic devices 44 are each constituted by the second embedded electrode 43, the second insulator layer 45 and the second upper electrode 46. The third memory portions 53 are each constituted by the third resistance variable layer 54, a second upper-layer electrode wire 49*a* and the embedded electrode 55 sandwiching the third resistance variable layer 54. The third non-ohmic devices 56 are each constituted by the third embedded electrode 55, the third insulator layer 57 and the third upper electrode 58.

The lower-layer electrode wire 15 is connected to the source region 12*a* of the active elements 12 via the embedded conductors 24 and 25, and the semiconductor electrode wire 26. In the same manner, the first upper-layer electrode wire 27 is connected to another active element (not shown) via the embedded conductor (not shown) and the semiconductor electrode wire (not shown). As shown in FIG. 11, the second upper-layer electrode wire 49 is connected to the source region 12*a* of another active element 12 via the embedded conductors 24, 25, 50, and 51 and the semiconductor electrode wire 26. The third upper-layer electrode wire 59 is connected to another active element (not shown) via the embedded conductor (not shown) and the semiconductor electrode wire (not shown), as in the first upper-layer electrode wire 27.

The lower-layer electrode wires 15 and the first upper-layer electrode wires 27 in the first stage serve as bit lines or word lines and are connected to the bit line decoder or the word line decoder in the circuit shown in FIG. 3. Also, in the same manner, the first upper-layer electrode wires 27 and the second upper-layer electrode wires 49 serve as bit lines or word lines and are connected to the bit line decoder or the word line decoder in the circuit shown in FIG. 3. The nonvolatile semiconductor memory apparatus 40 is designed so that when the first upper-layer electrode wires 27 serve as the bit lines in the first stage, they serve as the bit lines in the second stage as well, and the second upper-layer electrode wires 49 serve as the word lines. The nonvolatile semiconductor memory apparatus 40 is designed so that when the second upper-layer electrode wires 49 serve as the word lines, the third upper-layer electrode wires 59 serve as the bit lines.

As described above, in the nonvolatile semiconductor memory apparatus 40, the non-ohmic devices 20, 44, and 56 are respectively provided for the memory portions 17, 41, and 53 in the respective stages, writing and reading are stably and surely performed for the memory portions 17, 33, and 45 provided in the respective stages.

The manufacturing steps for the nonvolatile semiconductor memory apparatus 40 having the memory portions and the non-ohmic devices in the above multi-stage configuration may be accomplished basically by repeating the two kinds of manufacturing steps described for the nonvolatile semiconductor memory apparatus 40 of Embodiment 1

(Embodiment 3)

Figure 12:
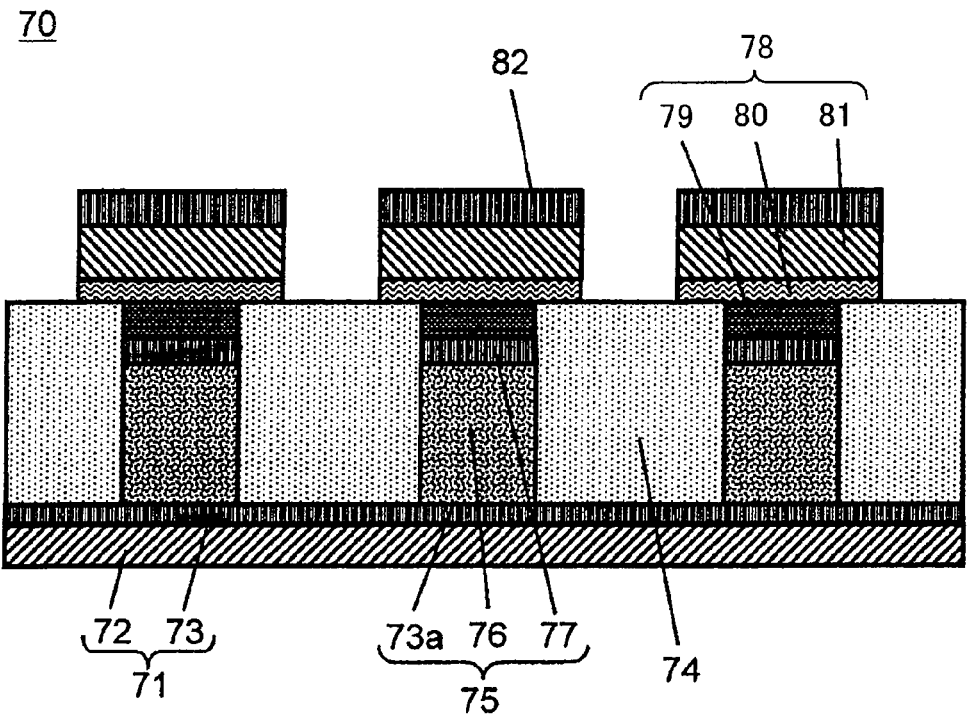
FIG. 12 is a cross-sectional view showing a configuration of memory portions and non-ohmic devices which are major constituents of a nonvolatile semiconductor memory apparatus according to Embodiment 3 of the present invention.

FIG. 12 is a cross-sectional view showing a configuration of memory portions 75 and non-ohmic devices 78 which are major constituents of a nonvolatile semiconductor memory apparatus 70 according to Embodiment 3 of the present invention. In the nonvolatile semiconductor memory apparatus 70 of this embodiment, a lower-layer electrode wire 71 includes at least two layers, and at the side connected with the resistance variable layer 76, an electrically conductor material which makes it difficult to diffuse a metal component forming a lower wire 72 (described later) into the resistance variable layer 76 and does not oxidize and reduce the resistance variable layer 76 is used for a connection electrode 73. Below the connection electrode 73, the lower wire 72 is provided using an electric conductor material made of, for example, Al or Cu, which is generally used in a semiconductor process.

Between the resistance variable layer 76 and an embedded electrode 79, a connection electrode 77 is provided in the same manner. The connection electrodes 73 and 77 may be formed of an electric conductor material such as platinum (Pt), titanium nitride (TiN) or tantalum nitride (TaN), for example. Further, semiconductor layers 80, upper electrodes 81 and connection electrodes 82 are provided in stripe shape such that they are respectively connected to the embedded electrodes 79 and respectively cross the lower-layer electrode wires 71. The connection electrodes 82 are extended to outside the matrix region and connected to the upper-layer electrode wires (not shown). Alternatively, the connection electrodes 82 may serve as the upper-layer electrode wires. The other configuration is identical to that of the nonvolatile semiconductor memory apparatus 10 of Embodiment 1 and will not be further described.

In such a configuration, memory portions 75 are each constituted by the resistance variable layer 76, a connection electrode 73a and the embedded connection electrode 77 sandwiching the resistance variable layer 76. The non-ohmic devices 78 which are comprised of MSM diodes are each constituted by the embedded electrode 79 which is a metal electrode layer, the upper electrode 81 and the semiconductor layer 80. The embedded electrode 79 which is the metal electrode layer is embedded to fill the contact hole.

The feature of this embodiment is that the non-ohmic device 78 is the MSM diode in which the embedded electrode 79 and the upper electrode 81 are formed of Al and the semiconductor layer 80 is formed of a nitrogen-deficiency silicone nitride (SiNx) film. The SiNx film having such a semiconductor property is formed by reactive sputtering in a nitrogen gas atmosphere using, for example, a Si target. For example, the SiNx film is formed under the condition in which the temperature is a room temperature, the chamber pressure is 0.1 Pa to 1 Pa, and the Ar/N2 flow rate is 18 sccm/2 sccm.

Alternatively, the embedded electrodes 79 and the upper electrodes 81 may be formed of Pt instead of Al. In a case where SiNx having a semiconductor property was formed to have a thickness of 16 nm under the above mentioned conditions, a current density of $2.5 \times 10^3$ A/cm$^2$ was obtained by applying a voltage of 1.6V and $5 \times 10^2$ A/cm$^2$ was obtained by application of a voltage of 0.8V. In a case where these voltages are used as a reference, an on/off ratio is 5. Thus, it was confirmed that the MSM diode is well operable as a non-ohmic device for use with the nonvolatile semiconductor memory apparatus.

Whereas in this embodiment, the connection electrodes 73 and 77 are provided on the both surfaces of the resistance variable layer 76, these may be omitted. For example, depending on selection of the material of the resistance variable layer 76, the connection electrodes 73 and 77 may in some cases are unnecessary. In this case, the nonvolatile semiconductor memory apparatus 70 may be configured as in the nonvolatile semiconductor memory apparatus 10 of Embodiment 1.

(Embodiment 4)

Figure 13:
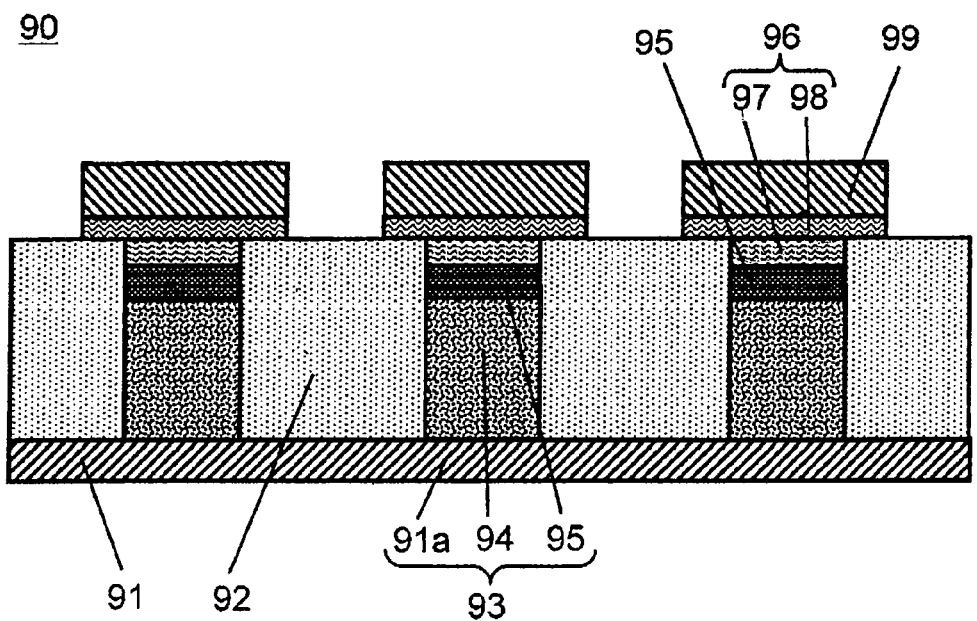
FIG. 13 is a cross-sectional view showing a configuration of memory portions and non-ohmic devices which are major constituents of a nonvolatile semiconductor memory apparatus according to Embodiment 4 of the present invention.

FIG. 13 is a cross-sectional view showing a configuration of memory portions 93 and non-ohmic devices 96 which are major constituents of a nonvolatile semiconductor memory apparatus 90 according to Embodiment 4 of the present invention. The feature of the nonvolatile semiconductor memory apparatus 90 of this embodiment is that a non-ohmic device 96 is constituted by a p-n junction diode having a laminated-layer structure of a p-type semiconductor layer 97 and an n-type semiconductor layer 98. Furthermore, this embodiment has a feature in which the p-type semiconductor layer 97 constituting the non-ohmic device 96 is embedded to fill the contact hole together with the embedded electrode 95. Instead of the p-type semiconductor layer 97, the n-type semiconductor layer 98 may be embedded together with the embedded electrode 95.

Memory portions 93 are each constituted by a resistance variable layer 94, a lower-layer electrode wire 91a and the embedded electrode 95 sandwiching the resistance variable layer 94. The lower-layer electrode wires 91, an interlayer insulating layer 92 and upper electrodes 99 have the same structures as those of the nonvolatile semiconductor memory apparatus 10 of Embodiment 1. The upper electrodes 99 are connected to the upper-layer electrode wires (not shown) outside the matrix region as in the nonvolatile semiconductor memory apparatus 10.

As a p-type semiconductor material forming the p-n junction diode, a material selected from, for example, ZnO, CdO, SnO$_2$, TiO$_2$, CeO$_2$, Fe$_3$O$_4$, WO$_3$, and Ta$_2$O$_5$ may be used. As an n-type semiconductor material, a material selected from, for example, Fe$_{(1-y)}$, O, NiO, CuO, Cu$_2$O, and MnO$_2$ may be used. In further alternative, p-doped silicon or n-doped silicon may be used.

In the present invention, instead of the MIM diode described in Embodiment 1, the MSM diode described in Embodiment 3, or the p-n junction diode described in Embodiment 4, the non-ohmic device may be a schottky diode forming a schottky connection between a semiconductor layer and an embedded electrode or a semiconductor layer and an upper electrode, for example. In this case, the nonvolatile semiconductor memory apparatus may have a configuration which is similar to that of the nonvolatile semiconductor memory apparatus 10 shown in FIG. 1 or the nonvolatile semiconductor memory apparatus 70 show in FIG. 12. Note that when the non-ohmic device is the schottky diode having a laminated-layer structure formed by two layers which are the semiconductor layer and the metal electrode layer, it is necessary to embed the embedded electrode which is the metal electrode layer to fill the contact hole. Using such a schottky diode, a configuration similar to that of the nonvolatile semiconductor memory apparatus 40 having the laminated-layer structure shown in FIG. 11 is attainable.

When the non-ohmic device is the schottky diode, advantages as described below are achieved. First, since the schottky diode is a majority carrier device unlike the p-n junction diode, accumulation of minority carrier does not occur, and thus the schottky diode enables the high-speed access. Second, since it is not necessary to form a p-n junction, a diode configuration is simple, and a manufacturing thereof is simplified. Third, the p-n junction has a problem associated with a property change depending on temperatures, but the schottky junction is stable with respect to temperatures, and can lessen a restriction such as a heating condition during manufacturing steps.

Furthermore, for example, the p-n junction diode has a high forward threshold (about 0.5V), whereas the schottky diode having an interface between, for example, titanium silicide and n-type silicon, has a forward threshold of 0.2V, and therefore makes it possible to suppress disturb during reading or writing.

(Embodiment 5)

Figure 14:
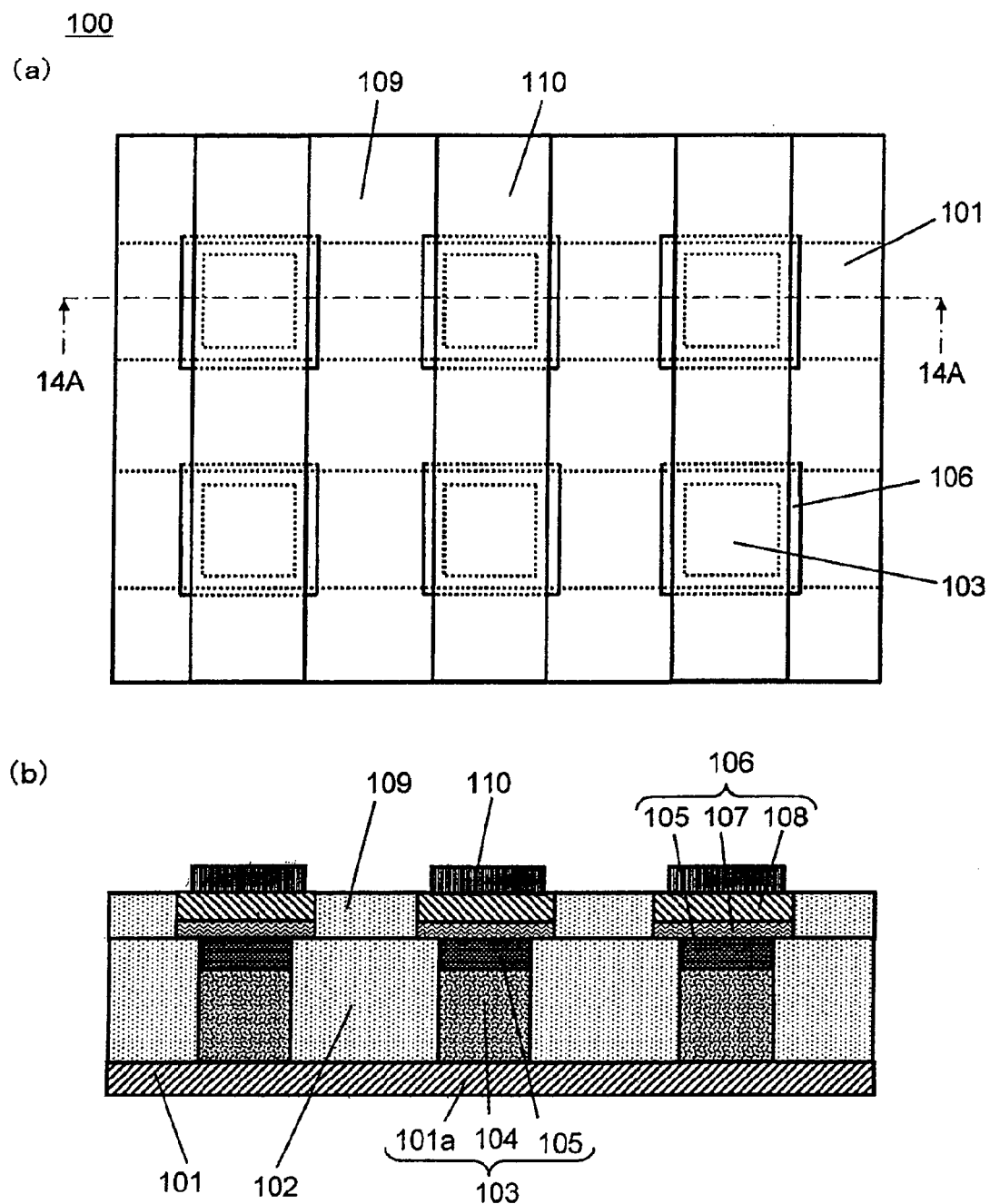
FIG. 14 is a cross-sectional view showing a configuration of memory portions and non-ohmic devices which are major constituents of a nonvolatile semiconductor memory apparatus according to Embodiment 5 of the present invention.

FIG. 14 is a cross-sectional view showing a configuration of memory portions 103 and non-ohmic devices 106 which are major constituents of a nonvolatile semiconductor memory apparatus 100 according to Embodiment 5 of the present invention. FIG. 14(a) is a plan view. FIG. 14(b) is a cross-sectional view taken in the direction of arrows along line 14A-14A. The nonvolatile semiconductor memory apparatus 100 of this embodiment has basically the same configuration as the nonvolatile semiconductor memory apparatus 10 of Embodiment 1, but has a feature in which each of an insulator layer 107 and an upper electrode 108 constituting a non-ohmic device 106 is isolated for each memory portion 103. For this reason, the upper-layer electrode wires 110 are provided in stripe shape on an interlayer insulating layer 109 embedded with the non-ohmic devices 106 such that the upper-layer electrode wires 110 are respectively connected to the upper electrodes 108 and respectively cross the lower-layer electrode wires 101.

In such a configuration, since the upper-layer electrode wires 110 are provided independently of the non-ohmic devices 106, they can be respectively made of optimal materials selected. In addition, a step for connecting the upper-layer electrode wires 110 to the active elements (not shown) via the embedded conductors (not shown) inside the contact holes provided outside the matrix region can be simplified.

The memory portions 103 are each constituted by a resistance variable layer 104, a lower-layer electrode wire 101a and an embedded electrode 105 sandwiching the resistance variable layer 104. The non-ohmic devices 106 are constituted by a MIM diode including the embedded electrode 105 which is the metal electrode layer, the upper electrode 108 and the insulator layer 107. When the non-ohmic devices 106 are the MIM diodes as described above, an area of the diodes can be increased and the insulator layers 107 can be thinned. Therefore, a current capacity can be increased, and a variation in property can be reduced.

The non-ohmic device 106 is not limited to the MIM diode. By using the semiconductor layer instead of the insulator layer 107, the MSM diode, the p-n junction diode or the schottky junction diode may be formed. Moreover, the nonvolatile semiconductor memory apparatuses of Embodiment 3 to Embodiment 5 may have a laminated-layer structure as in the nonvolatile semiconductor memory apparatus of Embodiment 2.

Whereas in this embodiment, the non-ohmic device 106 is isolated for each memory portion 103, it may be isolated for each set of plural memory portions 103.

Numerous modifications and alternative embodiments of the present invention will be apparent to those skilled in the art in view of the foregoing description. Accordingly, the description is to be construed as illustrative only, and is provided for the purpose of teaching those skilled in the art the best mode of carrying out the invention. The details of the structure and/or function may be varied substantially without departing from the spirit of the invention.

For example, in the above described embodiments, the resistance variable layers are embedded to fill the contact holes, this is merely exemplary. The resistance variable layers may be formed by upper surface portions of the lower-layer electrode wires so that they are positioned outside the contact holes, although this is not shown. In this case, electric connection may be made between the resistance variable layers and the non-ohmic devices using suitable electric conductors embedded to fill the contact holes.

Industrial Applicability

A nonvolatile semiconductor memory apparatus of the present invention is capable of simplifying a manufacturing method, of suppressing a variation in property of a non-ohmic device, of stabilizing a pressure resistance of the non-ohmic device, and of increasing a current capacity of the non-ohmic device, and therefore is useful in fields of a variety of electronic hardware using the nonvolatile memory apparatuses.

The invention claimed is:

1. A nonvolatile semiconductor memory apparatus comprising:
    a substrate;
    stripe-shaped lower-layer electrode wires provided on the substrate;
    an interlayer insulating layer which is disposed on the substrate including the lower-layer electrode wires and is provided with contact holes at locations respectively opposite to the lower-layer electrode wires;
    resistance variable layers which are respectively connected to the lower-layer electrode wires; and
    non-ohmic devices which are respectively provided on the resistance variable layers such that the non-ohmic devices are respectively connected to the resistance variable layers; wherein
    the non-ohmic devices each has a laminated-layer structure including plural semiconductor layers, a laminated-layer structure including a metal electrode layer and an insulator layer, or a laminated-layer structure including a metal electrode layer and a semiconductor layer; and wherein
    one layer of the laminated-layer structure is embedded to fill each of the contact holes and the semiconductor layer or the insulator layer which is the other layer of the laminated-layer structure has a larger area than an opening of each of the contact holes and is provided on the interlayer insulating layer.

2. The nonvolatile semiconductor memory apparatus according to claim 1, wherein a plurality of constituent units, each of which includes the interlayer insulating layer, the resistance variable layer, and the non-ohmic device, are stacked to form a layer structure.

3. The nonvolatile semiconductor memory apparatus according to claim 1, wherein the other layers of the laminated-layer structures respectively forming the non-ohmic devices are provided in stripe shape on the interlayer insulating layer so as to respectively cross the lower-layer electrode wires.

4. The nonvolatile semiconductor memory apparatus according to claim 1, further comprising:
    stripe-shaped upper-layer electrode wires which are provided on the non-ohmic devices such that the upper-layer electrode wires are respectively connected to the non-ohmic devices and respectively cross the lower-layer electrode wires.

5. The nonvolatile semiconductor memory apparatus according to claim 1, wherein the non-ohmic devices are MIM diodes each having a laminated-layer structure including three layers which are an insulator layer and metal electrode layers sandwiching the insulator layer, and the metal electrode layer which is closer to the resistance variable layer is embedded to fill each of the contact holes.

6. The nonvolatile semiconductor memory apparatus according to claim 1, wherein the non-ohmic devices are MSM diodes each having a laminated-layer structure including three layers which are a semiconductor layer and metal electrode layers sandwiching the semiconductor layer, and the metal electrode layer which is closer to the resistance variable layer is embedded to fill each of the contact holes.

7. The nonvolatile semiconductor memory apparatus according to claim 1, wherein the non-ohmic devices are p-n junction diodes each having a laminated-layer structure including two layers which are a p-type semiconductor layer and an n-type semiconductor layer, and the p-type semiconductor layer or the n-type semiconductor layer is embedded to fill each of the contact holes.

8. The nonvolatile semiconductor memory apparatus according to claim 1, wherein the non-ohmic devices are schottky diodes each having a laminated-layer structure including two layers which are a semiconductor layer and a metal electrode layer, and the metal electrode layer is embedded to fill each of the contact holes.

* * * * *